(12) United States Patent
Lee et al.

(10) Patent No.: US 12,550,269 B2
(45) Date of Patent: Feb. 10, 2026

(54) CIRCUIT BOARD

(71) Applicant: LG INNOTEK CO., LTD., Seoul (KR)

(72) Inventors: Hee Jung Lee, Seoul (KR); Jin Seok Lee, Seoul (KR); Yong Han Jeon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 261 days.

(21) Appl. No.: 18/263,621

(22) PCT Filed: Apr. 26, 2021

(86) PCT No.: PCT/KR2021/005228
§ 371 (c)(1),
(2) Date: Jul. 31, 2023

(87) PCT Pub. No.: WO2022/231015
PCT Pub. Date: Nov. 3, 2022

(65) Prior Publication Data
US 2024/0314937 A1    Sep. 19, 2024

(51) Int. Cl.
*H05K 1/11* (2006.01)
*H05K 1/02* (2006.01)
*H05K 3/28* (2006.01)

(52) U.S. Cl.
CPC ............... *H05K 3/282* (2013.01); *H05K 1/11* (2013.01); *H05K 1/111* (2013.01); *H05K 1/113* (2013.01);
(Continued)

(58) Field of Classification Search
CPC ................... H05K 3/282; H05K 1/113; H05K 2201/09218; H05K 2203/1377;
(Continued)

(56) References Cited

U.S. PATENT DOCUMENTS 6,831,236 B2 * 12/2004 Higuchi ............... H05K 3/4617
174/262
7,834,277 B2 * 11/2010 Ohsumi ................. H05K 3/427
174/266
(Continued)

FOREIGN PATENT DOCUMENTS

JP        9-275255 A      10/1997
JP     2006-108449 A       4/2006
(Continued)

OTHER PUBLICATIONS

International Search Report dated Jan. 20, 2022 in International Application No. PCT/KR2021/005228.
(Continued)

*Primary Examiner* — Ishwarbhai B Patel
(74) *Attorney, Agent, or Firm* — Saliwanchik, Lloyd & Eisenschenk

(57) ABSTRACT

A circuit board according to an embodiment includes an insulating layer including a first region and a second region; a circuit pattern disposed on an upper surface of the first region and an upper surface of the second region of the insulating layer; and a solder resist including a first portion disposed on the upper surface of the first region of the insulating layer and a second portion disposed the upper surface of the second region; wherein a height of the first portion of the solder resist is smaller than a height of the circuit pattern, wherein a height of the second portion of the solder resist is greater than the height of the circuit pattern, wherein at least one of the first region and the second region is divided into a plurality of partial regions, wherein at least one of the first portion and the second portion of the solder resist has a different height in the plurality of partial regions.

11 Claims, 16 Drawing Sheets

(52) U.S. Cl.
CPC ......... *H05K 1/0284* (2013.01); *H05K 1/0298* (2013.01); *H05K 2201/09218* (2013.01); *H05K 2203/1377* (2013.01)

(58) Field of Classification Search
CPC ........ H05K 1/111; H05K 3/28; H05K 3/3452; H05K 1/02; H05K 1/11; H05K 3/10; H05K 3/46
See application file for complete search history.

(56) References Cited

U.S. PATENT DOCUMENTS

| | | | | |
|---|---|---|---|---|
| 8,319,115 | B2* | 11/2012 | Ohsumi | H01L 23/49811 174/262 |
| 9,420,703 | B2* | 8/2016 | Hayashi | H05K 1/0298 |
| 9,497,864 | B2* | 11/2016 | Kung | H01L 21/563 |
| 9,565,760 | B2 | 2/2017 | Ishibashi et al. | |
| 9,844,142 | B2* | 12/2017 | Cho | H01L 23/3677 |
| 10,184,975 | B2 | 1/2019 | Okouchi et al. | |
| 2010/0252304 | A1* | 10/2010 | Muramatsu | H01L 23/3121 174/251 |
| 2015/0000968 | A1 | 1/2015 | Ishibashi et al. | |

FOREIGN PATENT DOCUMENTS

| | | |
|---|---|---|
| JP | 2015-222772 A | 12/2015 |
| JP | 2016-72386 A | 5/2016 |
| KR | 10-2014-0036005 A | 3/2014 |
| KR | 10-2015-0002506 A | 1/2015 |
| KR | 10-2076479 B1 | 2/2020 |
| KR | 10-2021-0114196 A | 9/2021 |

OTHER PUBLICATIONS

Office Action dated Nov. 18, 2024 in Korean Application No. 10-2020-0029574.

* cited by examiner

CIRCUIT BOARD

CROSS-REFERENCE TO RELATED APPLICATIONS

This application is the U.S. national stage application of International Patent Application No. PCT/KR2021/005228, filed Apr. 26, 2021, the disclosure of which is incorporated herein by reference in its entirety.

TECHNICAL FIELD

An embodiment relates to a circuit board, and more particularly, to a circuit board in which a circuit pattern of an outermost layer of the circuit board can be supported using a solder resist and a method for manufacturing the circuit board.

BACKGROUND ART

A line width of circuits is becoming smaller as the miniaturization, weight reduction, and integration of electronic components accelerate. In particular, as design rules of semiconductor chips are integrated on a nanometer scale, a circuit line width of a package substrate or a circuit board on which a semiconductor chip is mounted is reduced to several micrometers or less.

In order to increase the degree of circuit integration of the circuit board, that is, various methods have been proposed in order to miniaturize the circuit line width. In order to inhibit loss of circuit line width in the etching step to form a pattern after copper plating, a semi-additive process (SAP) method and a modified semi-additive process (MSAP) have been proposed.

Since then, in order to realize a finer circuit pattern, an Embedded Trace Substrate (hereinafter referred to as 'ETS') method, which buries and embeds copper foil in an insulating layer, has been used in this technology field. The ETS method is manufactured by embedding the copper foil circuit in the insulating layer instead of forming it on the surface of the insulating layer. For this reason, there is no circuit loss due to etching, so it is advantageous to refine the circuit pitch.

Meanwhile, recently, efforts are being made to develop an improved 5th generation (5G) communication system or a pre-5G communication system in order to meet the demand for wireless data traffic. Here, the 5G communication system uses ultra-high frequency (mmWave) bands (sub 6 gigabytes (6 GHz), 28 gigabytes 28 GHz, 38 gigabytes 38 GHz or higher frequencies) to achieve high data rates.

And, in order to alleviate the path loss of radio waves in the very high frequency band and increase the propagation distance of radio waves, aggregation technologies such as beamforming, massive MIMO, and array antenna are being developed in the 5G communication system. Considering that these frequency bands can consist of hundreds of active antennas of wavelengths, the antenna system becomes relatively large.

Since these antennas and AP modules are patterned or mounted on a circuit board, low loss of the circuit board is very important. This means that several substrates constituting the active antenna system, ie, an antenna substrate, an antenna feeding substrate, a transceiver substrate, and a baseband substrate, must be integrated into one compact unit.

And, the circuit board applied to the 5G communication system as described above is manufactured in the trend of light, thin and compact, accordingly, the circuit pattern is becoming more and more fine.

However, the conventional circuit board including a fine circuit pattern has a structure in which the outermost circuit pattern protrudes on the insulating layer, and accordingly, there is a problem in that the outermost circuit pattern easily collapses.

DISCLOSURE

Technical Problem

The embodiment provides a circuit board having a novel structure and a method of manufacturing the same.

In addition, the embodiment provides a circuit board capable of improving reliability by providing a structure including a solder resist capable of supporting a circuit pattern disposed at an outermost portion, and a method of manufacturing the same.

In addition, the embodiment provides a circuit board capable of providing a structure including a solder resist capable of supporting a circuit pattern disposed in a SR exposed region among circuit patterns disposed at the outermost portion, and a method of manufacturing the same.

The technical problem to be solved in the embodiment is not limited to the technical problem mentioned above, and another technical problem not mentioned will be clearly understood by those of ordinary skill in the art to which the present invention belongs from the following description.

Technical Solution

A circuit board according to an embodiment comprises an insulating layer including a first region and a second region; a circuit pattern disposed on an upper surface of the first region and an upper surface of the second region of the insulating layer; and a solder resist including a first portion disposed on the upper surface of the first region of the insulating layer and a second portion disposed the upper surface of the second region; wherein a height of the first portion of the solder resist is smaller than a height of the circuit pattern, wherein a height of the second portion of the solder resist is greater than the height of the circuit pattern, wherein at least one of the first region and the second region is divided into a plurality of partial regions, and wherein at least one of the first portion and the second portion of the solder resist has a different height in the plurality of partial regions.

In addition, the circuit pattern includes at least two of a trace, a first pad, and a second pad, and the plurality of partial regions includes at least two of a first partial region in which the trace is disposed, a second partial region in which the first pad is disposed, and a third partial region in which the second pad is disposed.

In addition, the first portion of the solder resist includes: a first-first portion disposed on the first partial region; a first-second portion disposed on the second partial region; and a first-third portion disposed on the third partial region; wherein the first-first portion to the first-third portion have different heights.

In addition, a height of the first-first portion is smaller than a height of the first-second portion, wherein the height of the first-second portion is smaller than a height of the first-third portion, and wherein the heights of the first-first portion to the first-first portion are smaller than the height of the circuit pattern, respectively.

In addition, the second portion of the solder resist includes: a second-first portion disposed on the first partial region; a second-second portion disposed on the second partial region, and a second-third portion disposed on the third partial region; wherein the second-first portion to the second-third portion have different heights.

In addition, a height of the second-first portion is smaller than a height of the second-second portion, wherein the height of the second-second portion is smaller than a height of the second-third portion, and wherein the heights of the second-first to second-third portions are greater than the heights of the circuit patterns, respectively.

In addition, an upper surface of the first portion of the solder resist has a center line surface roughness (Ra) different from a center line surface roughness (Ra) of an upper surface of the second portion of the solder resist.

In addition, a boundary side surface between the upper surface of the first portion and the upper surface of the second portion of the solder resist has a center line surface roughness (Ra) different from the center line surface roughness (Ra) of each of the upper surface of the first portion and the upper surface of the second portion.

In addition, the center line surface roughness (Ra) of the upper surface of the first portion is greater than the center line surface roughness (Ra) of the upper surface of the second portion, and wherein the center line surface roughness (Ra) of the boundary side surface is smaller than the center line surface roughness (Ra) of the upper surface of the first portion and is greater than the center line surface roughness (Ra) of the upper surface of the second portion.

In addition, the height of the first portion of the solder resist satisfies a range of 70% to 90% of the height of the circuit pattern.

In addition, the first region is a solder resist open region, and the second region is a solder resist disposition region.

In addition, the insulating layer includes a plurality of insulating layers, wherein the circuit pattern protrudes and is disposed on an upper surface of an uppermost insulating layer among the plurality of insulating layers, and wherein a primer layer is disposed between the uppermost insulating layer, the circuit pattern, and the solder resist.

On the other hand, the method of manufacturing the circuit board according to the embodiment comprises preparing an inner layer substrate; on the inner layer substrate, forming an uppermost insulating layer having a primer layer disposed thereon; forming a circuit pattern on the primer layer of the uppermost insulating layer; forming a solder resist layer covering the circuit pattern on the primer layer; by partially exposing and developing the solder resist layer, forming a solder resist including a first portion having a height smaller than the circuit pattern in a first region and a second portion having a height greater than the circuit pattern in a second region, and wherein at least one of the first region and the second region is divided into a plurality of partial regions, wherein at least one of the first portion and the second portion of the solder resist has a different height in the plurality of partial regions; wherein the circuit pattern includes at least two of a trace, a first pad, and a second pad, wherein the plurality of partial regions includes at least two of a first partial region in which the trace is disposed, a second partial region in which the first pad is disposed; and a third partial region in which the second pad is disposed are included.

In addition, the first portion of the solder resist includes: a first-first portion disposed on the first partial region; a first-second portion disposed on the second partial region; and a first-third portion disposed on the third partial region; wherein the first-first portion to the first-third portion have different heights; wherein a height of the first-first portion is smaller than a height of the first-second portion, wherein the height of the first-second portion is smaller than a height of the first-third portion, and wherein the heights of the first-first portion to the first-first portion are smaller than the height of the circuit pattern, respectively.

In addition, the second portion of the solder resist includes: a second-first portion disposed on the first partial region; a second-second portion disposed on the second partial region; and a second-third portion disposed on the third partial region; wherein the second-first portion to the second-third portion have different heights; wherein a height of the second-first portion is smaller than a height of the second-second portion, wherein the height of the second-second portion is smaller than a height of the second-third portion, and wherein the heights of the second-first to second-third portions are greater than the heights of the circuit patterns, respectively.

In addition, the upper surface of the first portion of the solder resist, the upper surface of the second portion, and the boundary side surface between the upper surface of the first portion and the upper surface of the second portion of the solder resist have different center line surface roughness (Ra).

In addition, the center line surface roughness (Ra) of the upper surface of the first portion is greater than the center line surface roughness (Ra) of the upper surface of the second portion, and wherein the center line surface roughness (Ra) of the boundary side surface is smaller than the center line surface roughness (Ra) of the upper surface of the first portion and is greater than the center line surface roughness (Ra) of the upper surface of the second portion.

In addition, the height of the first portion of the solder resist satisfies a range of 70% to 90% of the height of the circuit pattern.

Advantageous Effects

The circuit board in this embodiment is a circuit board having a multilayer structure of 8 or more layers, and includes an outer layer circuit pattern disposed on an uppermost outer insulating layer of the multilayers and protruding from the surface of the outer insulating layer. In this case, the outer layer circuit pattern includes a second-first circuit pattern disposed in a second region in which a solder resist (SR) is disposed among an upper region of the outer insulating layer, and a second-second circuit pattern disposed in a first region that is an open region where the solder resist is not disposed. In this case, the second-first circuit pattern may be supported by being surrounded by the solder resist, but since the second-second circuit pattern does not have a support layer capable of supporting the second-first circuit pattern, it may easily collapse due to various factors.

Accordingly, a support layer capable of supporting the second-second circuit pattern in the embodiment is formed on an outer insulating layer. In this case, the support layer in the embodiment may be implemented with a solder resist. Preferably, the solder resist of the embodiment is disposed between a plurality of second-second circuit patterns while covering the second-first circuit pattern and exposing the second-second circuit pattern.

Accordingly, the embodiment can solve problems such as collapsing or abrasion of the protruded outer layer circuit pattern by miniaturization of the outer layer circuit pattern, and thus product reliability can be improved. In particular, the embodiment can solve problems such as collapsing or rubbing of the outer layer circuit pattern in the first region, thereby improving product reliability.

In addition, when removing the solder resist of the embodiment, they are removed using an exposure and development method rather than a sand blast or plasma method. In this case, when removing the solder resist using a sandblasting or plasma method, the outer layer circuit pattern may be deformed, and in some cases, a cross-section of the outer layer circuit pattern may have a triangular shape. And, when the cross section of the outer layer circuit pattern has a triangle, an adhesive member may not be stably disposed on the outer layer circuit pattern, and thus a reliability problem may occur. In contrast, the solder resist in the embodiment may be removed without deformation of the outer layer circuit pattern, and thus reliability may be improved.

In addition, the circuit board of the embodiment can be applied to a 5G communication system, and thus, it is possible to further improve reliability by minimizing transmission loss at high frequencies. Specifically, the circuit board in the embodiment can be used at a high frequency and can reduce propagation loss.

MODES OF THE INVENTION

Figure 1A:
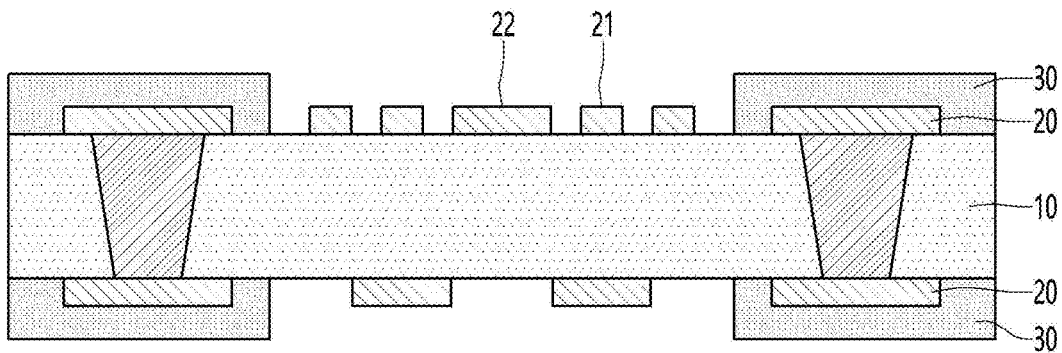
FIGS. 1A and 1B are views showing a circuit board according to a comparative example.

Hereinafter, embodiments disclosed in the present specification will be described in detail with reference to the accompanying drawings, but identical or similar elements are denoted by the same reference numerals regardless of reference numerals, and redundant descriptions thereof will be omitted. The suffixes "module" and "portion" for the components used in the following description are given or used interchangeably in consideration of only the ease of writing the specification, and do not have meanings or roles that are distinguished from each other by themselves. In addition, in describing the embodiments disclosed in the present specification, if it is determined that a detailed description of related known technologies may obscure the subject matter of the embodiments disclosed in the present specification, the detailed description thereof will be omitted. In addition, the accompanying drawings are only for making it easier to understand the embodiments disclosed in the present specification, and the technical idea disclosed in the present specification is not limited by the accompanying drawings, and this should be understood to include all changes, equivalents, or substitutes included in the spirit and scope of the present invention.

Terms including ordinal numbers such as first and second may be used to describe various elements, but the elements are not limited by the terms. The above terms are used only for the purpose of distinguishing one component from another component.

When a component is referred to as being "contacted" or "connected" to another component, it may be directly connected or connected to the other component, but other components may exist in the middle. On the other hand, when a component is referred to as being "directly contacted" or "directly connected" to another component, it should be understood that there is no other component in the middle.

Singular expressions include plural expressions unless the context clearly indicates otherwise.

In the present application, terms such as "comprises" or "have" are intended to designate the presence of features, numbers, steps, actions, components, parts, or combinations thereof described in the specification, but one or more other features. It is to be understood that the presence or addition of elements or numbers, steps, actions, components, parts, or combinations thereof, does not preclude in advance the possibility of being excluded.

Hereinafter, exemplary embodiments of the present invention will be described in detail with reference to the accompanying drawings.

Before describing a present embodiment, a comparative example compared with the present embodiment will be described.

Figure 1B:
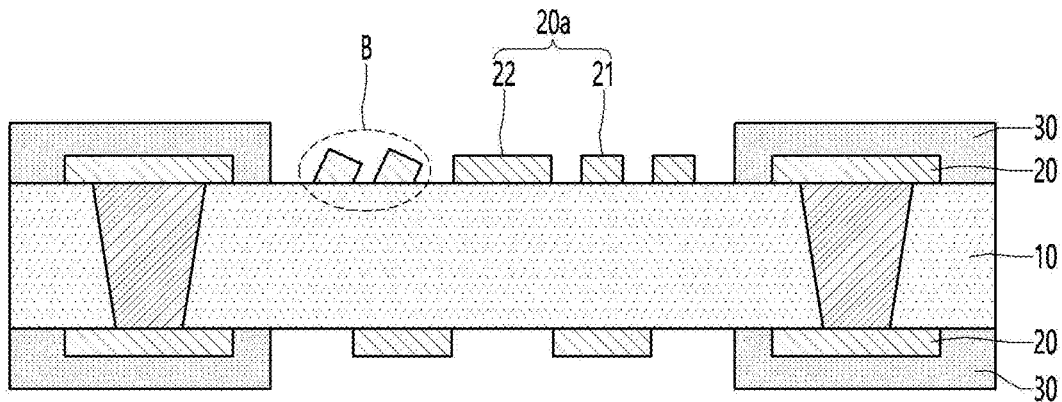

FIGS. 1A and 1B are views showing a circuit board according to a comparative example.

Referring to FIGS. 1A and 1B, as in FIG. 1A, a circuit board according to a comparative example includes a circuit pattern manufactured by a general SAP method.

Specifically, the circuit board includes an insulating layer 10, a circuit pattern 20, and a protective layer 30.

The circuit pattern 20 is disposed on upper and lower surfaces of the insulating layer 10, respectively.

In this case, at least one of the circuit patterns 20 disposed on the surface of the insulating layer 10 includes a fine circuit pattern.

Referring to FIGS. 1A and 1B, the circuit pattern 20 disposed on the upper surface of the insulating layer 10 includes a fine circuit pattern. The fine circuit pattern includes a trace 21 which is a signal transmission wiring line, and a pad 22 for chip mounting and the like.

In this case, the embodiment forms a support layer using a solder resist for the purpose of protecting the fine circuit pattern, and accordingly, in the comparative example, the structure in the region where the fine circuit pattern is formed will be described.

In addition, a protective layer 30 for protecting the circuit pattern 20 is disposed on the surface of the insulating layer 10.

In this case, an upper region of the insulating layer 10 includes a first region in which the protective layer 30 is disposed and a second region that is an open region in which the protective layer 30 is not disposed.

Accordingly, a part of the circuit pattern 20 disposed on the upper surface of the insulating layer 10 is covered by the protective layer 30, and the remaining part is exposed to an outside without being covered by the protective layer 30.

In this case, the trace 21 and the pad 22 corresponding to the fine circuit pattern as described above are disposed in the second region that is the open region of the protective layer 30.

For example, at least one of the trace 21 and the pad 22 has a width/spacing of 15 µm/15 µm or less.

In this case, when the circuit pattern formed in the open region of the protective layer 30 is a pattern having a width exceeding 15 µm rather than a fine circuit pattern, it may be strong against external impact.

However, as shown in FIG. 1B, the width and spacing of the trace 21 and the pad 22, which are the fine circuit patterns of an outermost layer, are getting smaller as the circuit pattern is gradually refined, the fine circuit pattern easily collapses due to an external impact when the fine circuit pattern protruding one the upper surface of the insulating layer 10 is disposed in the second region that is the open region of the protective layer.

That is, as in B of FIG. 1B, the trace 21 corresponding to the fine circuit pattern of the outermost layer has an extremely fine pattern shape, and thus it can easily collapse or be swept away by a small external impact.

On the other hand, recently, a fine circuit pattern disposed in an open region of the protective layer while having a structure buried in the insulating layer is formed using the ETS method.

Figure 2:
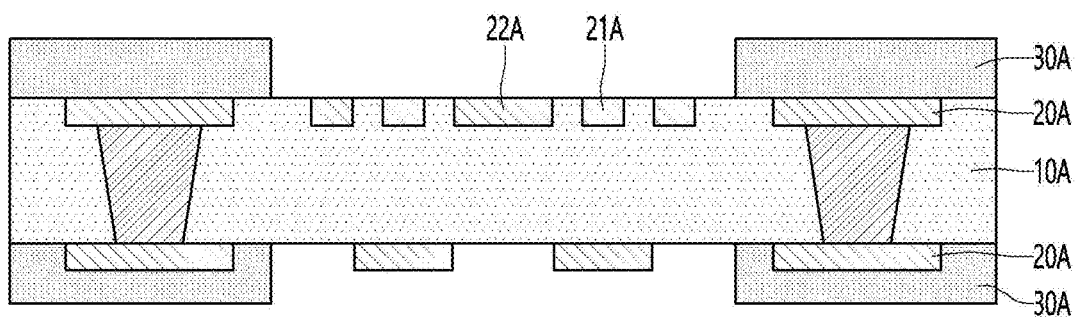
FIG. 2 is a view showing a circuit board manufactured by an ETS method in a comparative example.

FIG. 2 is a view showing a circuit board manufactured by an ETS method in a comparative example.

Referring to FIG. 2, specifically, the circuit board includes an insulating layer 10A, a circuit pattern 20A, and a protective layer 30A.

The circuit pattern 20A is disposed on upper and lower surfaces of the insulating layer 10A, respectively.

In this case, at least one of the circuit patterns 20A disposed on the surface of the insulating layer 10A includes a fine circuit pattern.

Here, when the circuit pattern is formed by the ETS method, the first circuit pattern formed has a structure buried in the insulating layer 10A. Accordingly, when an initially formed circuit pattern is formed as a fine circuit pattern, the fine circuit pattern may have a structure in which the fine circuit pattern is buried in the insulating layer 10A even in the comparative example.

That is, the circuit board manufactured by the ETS method includes a fine circuit pattern having a structure buried in the surface of the insulating layer 10A. That is, the fine circuit pattern includes a trace 21A, which is a signal transmission wiring line, and a pad 22A for mounting a chip or the like.

And, when the circuit board is manufactured by the ETS method as described above, the fine circuit pattern can be protected from external impact, and because the fine circuit pattern has a structure buried in the insulating layer.

In this case, as in FIG. 2, when a substrate having a two-layer structure (based on the number of layers of a circuit pattern) is manufactured by the ETS method, there is no major problem. However, when manufacturing a circuit board having 8 or more layers, especially 10 layers or more, using the ETS method, the lead time for manufacturing it is at least 2 months or more, and accordingly, there is a problem in that productivity decreases.

In addition, the fine circuit pattern must firstly be formed during the manufacturing process of the multilayer circuit board in order to manufacture the fine circuit pattern of the buried structure by the ETS method. And, the circuit board of 8 to 10 layers are required in order to be applied to an AP module of recent high integration/high specification, etc. In this case, when the subsequent multilayer lamination process is performed in the state in which the fine circuit pattern is first formed during the ETS process, damage is applied to the fine circuit pattern due to thermal stress or the like, and accordingly, there is a problem in that it is difficult to normally implement the fine circuit pattern.

In addition, when the circuit board is manufactured by the ETS method, an ETS core layer is separately required. In this case, when the circuit board is manufactured by the ETS method, an additional process for finally removing the ETS core layer is required.

In addition, when manufacturing a circuit board by the ETS method, yield is reduced due to cumulative tolerance due to layer laminating more than a certain number of times, and accordingly, there is a problem in that the product cost increases. In addition, there is a problem in that pattern damage increases due to the stress caused by the lamination process being performed on both sides of the ETS core layer.

In addition, recently, interest in circuit boards that can reflect the development of 5G technology is increasing. In this case, in order to apply the 5G technology, the circuit board must have a high multi-layer structure, and accordingly the circuit pattern must be miniaturized. However, although it is possible to form a fine pattern in the comparative example, there is a problem in that it cannot be stably protected.

Accordingly, the embodiment provides a circuit board having a new structure capable of solving the reliability problem of an outermost fine pattern and a method for controlling the same.

Figure 3:
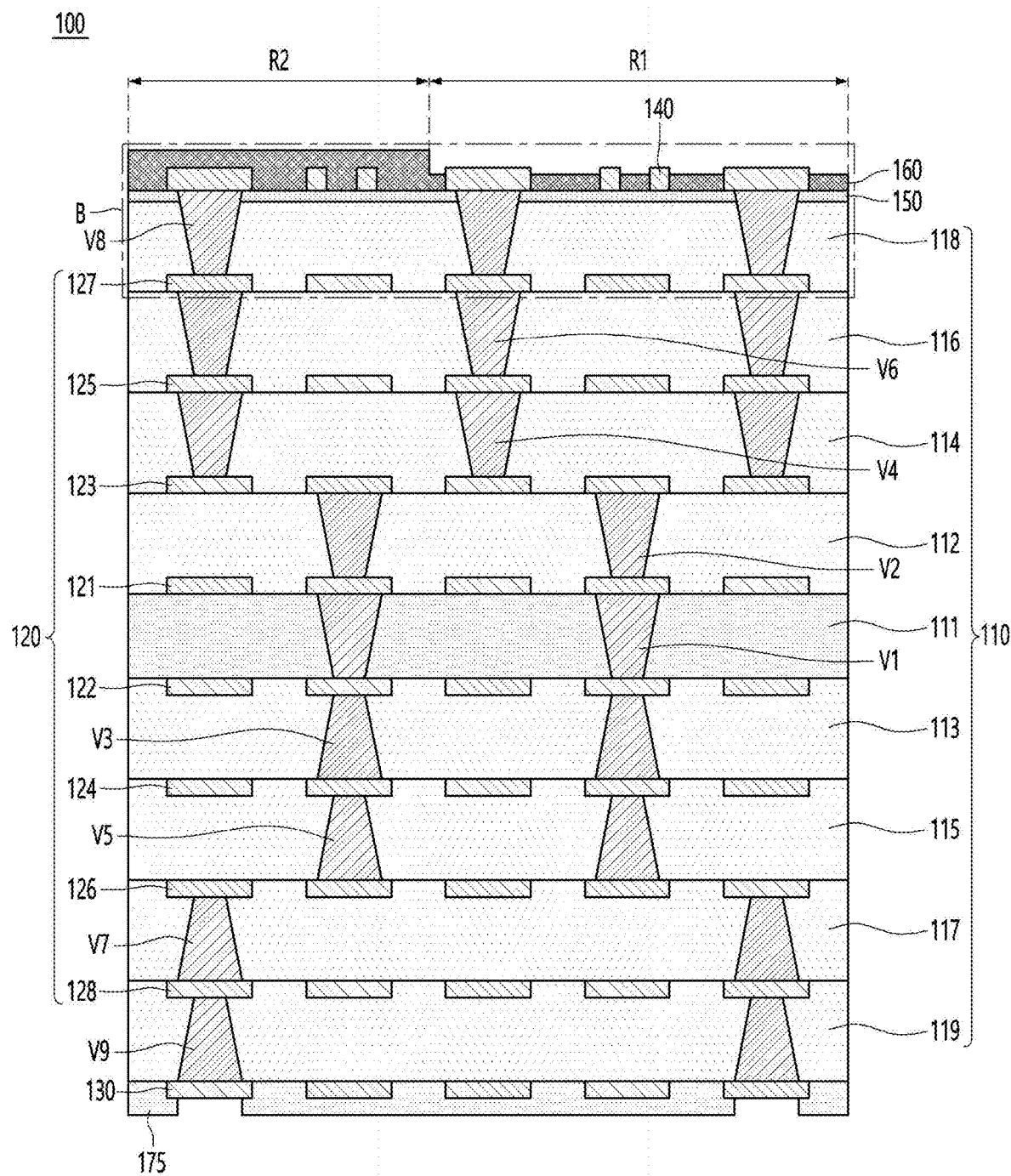
FIG. 3 is a view showing a circuit board according to an embodiment.
Figure 4:
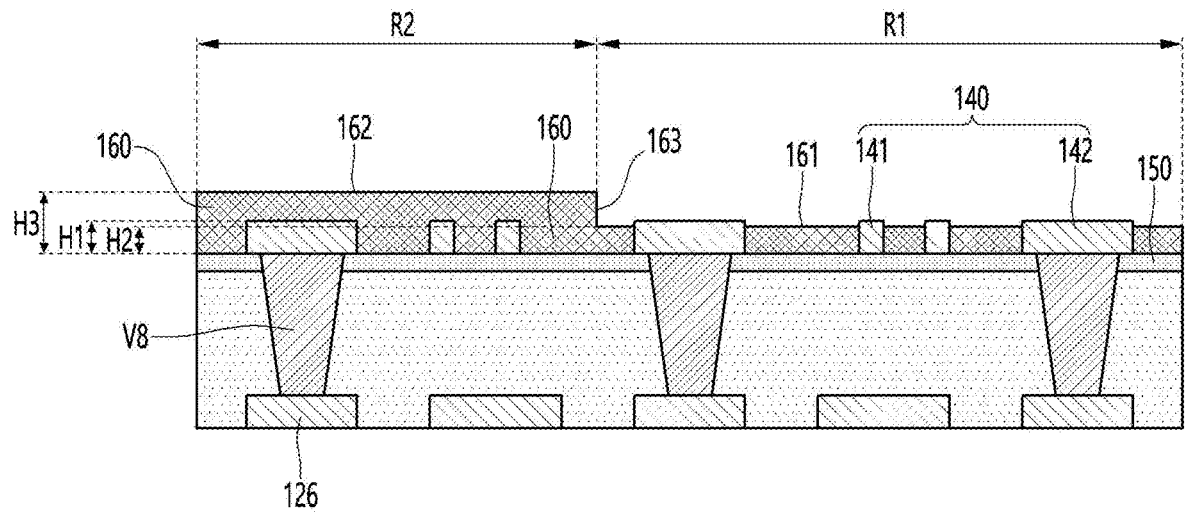
FIG. 4 is an enlarged view of region B of FIG. 3.

FIG. 3 is a view showing a circuit board according to an embodiment, and FIG. 4 is an enlarged view of region B of FIG. 3

Before describing FIGS. 3 and 4, the circuit board according to the embodiment may have a multilayer structure. Preferably, the circuit board according to the embodiment may have a structure of 10 or more layers based on the number of layers of the circuit pattern. However, this is only an example, and is not limited thereto. That is, the circuit board according to the embodiment may have a number of layers smaller than 10 layers, or alternatively, may have a number of layers larger than 10 layers.

However, the circuit board in the embodiment is for solving the problem of the ETS method of the comparative example. In this case, the ETS method in the comparative example has many problems in manufacturing a circuit board with 8 or more layers, and accordingly, the embodiment will be described as having a 10-layer structure for comparison.

FIGS. 3 and 4, the circuit board 100 includes an insulating layer 110.

Preferably, the circuit board 100 may include first to ninth insulating layers 111, 112, 113, 114, 115, 116, 117, 118, and 119 to implement a 10-layer structure.

In this case, the first insulating layer 111, the second insulating layer 112, the third insulating layer 113, the fourth insulating layer 114, the fifth insulating layer 115, and the sixth insulating layer 116 and the seventh insulating layer 117 may be internal insulating layers disposed at an inside in the laminated structure of insulating layers, the eighth insulating layer 118 may be an uppermost insulating layer (first outermost insulating layer) disposed on an upper portion of the inner insulating layer, and the ninth insulating layer 119 may be a lowermost insulating layer (a second outermost insulating layer) disposed below a lower portion of the inner insulating layer.

The first insulating layer 111 may be a core insulating layer disposed at a center in the laminated structure of the insulating layer 110. The second insulating layer 112, the fourth insulating layer 114, the sixth insulating layer 116, and the eighth insulating layer 118 may be an upper insulating layer sequentially disposed on the first insulating layer 111. In addition, the third insulating layer 113, the fifth insulating layer 115, the seventh insulating layer 117, and the ninth insulating layer 119 may be a lower insulating layer sequentially disposed under the first insulating layer 111.

The insulating layer 110 is a substrate on which an electric circuit capable of changing wiring is formed, and may include all of a printed circuit board and an insulating substrate made of an insulating material capable of forming circuit patterns on the surface thereof.

For example, at least one of the first to ninth insulating layers 111, 112, 113, 114, 115, 116, 117, 118, and 119 of the insulating layer 110 may be rigid or may be flexible. For example, at least one of the first to ninth insulating layers 111, 112, 113, 114, 115, 116, 117, 118, and 119 of the insulating layer 110 may include glass or plastic. In detail, at least one of the first to ninth insulating layers 111, 112, 113, 114, 115, 116, 117, 118, and 119 of the insulating layer 110 may include chemically strengthened/semi-tempered glass such as soda lime glass or aluminosilicate glass, or strengthened or flexible plastic such as polyimide (PI), polyethylene terephthalate (PET), propylene glycol (PPG) and polycarbonate (PC), or sapphire.

In addition, at least one of the first to ninth insulating layers 111, 112, 113, 114, 115, 116, 117, 118, and 119 of the insulating layer 110 may include an optical isotropic film. For example, at least one of the first to ninth insulating layers 111, 112, 113, 114, 115, 116, 117, 118, and 119 of the insulating layer 110 may be includes COC (cyclic Olefin Copolymer), COP (Cyclic Olefin Polymer), photo isotropic polycarbonate (polycarbonate, PC), or photo isotropic polymethyl methacrylate (PMMA).

In addition, at least one of the first to ninth insulating layers 111, 112, 113, 114, 115, 116, 117, 118, and 119 of the insulating layer 110 may be bent while having a partially curved surface. That is, at least one of the first to ninth insulating layers 111, 112, 113, 114, 115, 116, 117, 118, and 119 of the insulating layer 110 may be bent while having a partially flat surface and a partially curved surface. In detail, at least one of the first to ninth insulating layers 111, 112, 113, 114, 115, 116, 117, 118, and 119 of the insulating layer 110 may have a curved end while having a curved surface, or may have a surface including a random curvature and may be bent or curved.

In addition, at least of the insulating layer 110 may be a flexible substrate having a flexible characteristic. Also, at least of the insulating layer 110 may be a curved or bent substrate. In this case, at least one of the insulating layer 110 may represent an electrical wiring connecting circuit components based on a circuit design as a wiring diagram, and an electrical conductor may be reproduced on the insulating material. In addition, at least one of the insulating layers 110 may form a wiring for mounting electrical components and circuitry connecting them, and may mechanically fix components other than the electrical connection function of the components.

A circuit pattern may be disposed on a surface of the insulating layer 110.

That is, circuit patterns may be disposed on respective surfaces of the first to ninth insulating layers 111, 112, 113, 114, 115, 116, 117, 118, and 119 constituting the insulating layer 110.

Here, the circuit pattern may include an inner layer circuit pattern 120 and outer layer circuit patterns 130 and 140. The inner layer circuit pattern 120 may be a circuit pattern disposed at an inside the insulating layer 110 in the laminated structure of the circuit board, and the outer layer circuit patterns 130 and 140 may be circuit patterns disposed at an outermost side of the insulating layer 110 in the laminated structure of the circuit board.

The inner layer circuit pattern 120 may include a first circuit pattern 121, a second circuit pattern 122, a third circuit pattern 123, a fourth circuit pattern 124, a fifth circuit pattern 125, and a sixth circuit pattern 126 and a seventh circuit pattern 127.

The first circuit pattern 121 may be disposed on an upper surface of the first insulating layer 111, and thus may be covered by the second insulating layer 112. The second circuit pattern 122 may be disposed on a lower surface of the first insulating layer 111, and thus may be covered by the third insulating layer 113. The third circuit pattern 123 may be disposed on an upper surface of the second insulating layer 112, and thus may be covered by the fourth insulating layer 114. The fourth circuit pattern 124 may be disposed on a lower surface of the third insulating layer 113, and thus may be covered by the fifth insulating layer 115. The fifth circuit pattern 125 may be disposed on an upper surface of the fourth insulating layer 114, and thus may be covered by the sixth insulating layer 116. The sixth circuit pattern 126 may be disposed on a lower surface of the fifth insulating layer 115, and thus may be covered by the seventh insulating layer 117. The seventh circuit pattern 127 may be disposed on an upper surface of the sixth insulating layer 116, and thus may be covered by the eighth insulating layer 118. The eighth circuit pattern 128 may be disposed on a lower surface of the seventh insulating layer 117, and thus may be covered by the ninth insulating layer.

The outer layer circuit pattern may be disposed on a surface of an outermost insulating layer disposed at an outermost portion of the insulating layer 110. Preferably, the outer layer circuit pattern may include the first outer layer circuit pattern 130 disposed on a lower surface of the ninth insulating layer 119 disposed at the lowermost portion of the insulating layer 110.

In addition, the outer layer circuit pattern may include a second outer layer circuit pattern 140 disposed on an upper surface of the eighth insulating layer 118 disposed at an uppermost portion of the insulating layer 110.

In this case, at least one of the first outer layer circuit pattern 130 and the second outer layer circuit pattern 140 may be formed to protrude from the surface of the insulating layer. Preferably, the first outer layer circuit pattern 130 may be formed to protrude below the lower surface of the ninth insulating layer 119. In addition, the second outer layer circuit pattern 140 may be formed to protrude above the upper surface of the eighth insulating layer 118.

That is, the upper surface of the first outer layer circuit pattern 130 may be positioned on the same plane as the lower surface of the ninth insulating layer 119. In addition, the second outer layer circuit pattern 140 may have a lower surface positioned on the same plane as the upper surface of the primer layer 150 disposed on the upper surface of the eighth insulating layer 180.

In other words, a primer layer 150 may be disposed on the upper surface of the eighth insulating layer 180 and the second outer layer circuit pattern 140.

That is, the second outer layer circuit pattern 140 may include a fine circuit pattern. Preferably, the second outer layer circuit pattern 140 may be a fine circuit pattern having a line width of 10 µm or less and a spacing between the patterns of 10 µm or less. Accordingly, when the second outer layer circuit pattern 140 is directly disposed on the eighth insulating layer 118, a contact area between the eighth insulating layer 118 and the second outer layer circuit pattern 140 is small, and whereby a situation in which the second outer layer circuit pattern 150 is separated from the eighth insulating layer 118 may occur.

Accordingly, the primer layer 150 in the embodiment is disposed between the second outer layer circuit pattern 140 and the eighth insulating layer 118. The primer layer 150 may improve adhesion between the second outer layer circuit pattern 140 and the eighth insulating layer 118. The primer layer 150 may be disposed to completely cover the upper surface of the eighth insulating layer 118. In addition, the second outer layer circuit pattern 140 may be partially disposed on the primer layer 150. Accordingly, an upper surface of the primer layer 150 in the embodiment may include a first portion in contact with the second outer layer circuit pattern 140 and a second portion in contact with a lower surface of a solder resist 160 to be described later. That is, when forming the second outer layer circuit pattern 140 by the SAP process, the primer layer 150 may serve to strengthen the bonding force between the eighth insulating layer 118 and the second outer layer circuit pattern 140. Such a primer layer 150 may include a polyurethane-based resin, an acrylic resin, or a silicone-based resin, but is not limited thereto Meanwhile, in FIG. 3, it is illustrated that no primer layer is disposed between the ninth insulating layer 119 and the first outer layer circuit pattern 130, but, the primer layer may also be disposed between the ninth insulating layer 119. However, the first outer layer circuit pattern 130 may not be a fine circuit pattern, and accordingly, the primer layer between the ninth insulating layer 119 and the first outer layer circuit pattern 130 may be selectively omitted.

Consequently, when the fine circuit pattern is disposed on the inner layer, the primer layer may be omitted as it is covered by at least one of the insulating layers 110. On the other hand, when the fine circuit pattern in the embodiment is disposed on the outermost layer, there is no insulating layer covering the fine circuit pattern, and the primer layer 150 may be disposed to improve bonding strength between the fine circuit pattern and the insulating layer.

Hereinafter, it will be described that the second outer layer circuit pattern 140 is formed as a fine circuit pattern. However, the embodiment is not limited thereto, and the first outer layer circuit pattern 130 may also be formed as a fine circuit pattern. Accordingly, it will be apparent that a structure for improving reliability, such as strengthening the bonding strength of the second outer layer circuit pattern 140 and inhibiting collapsing, which will be described below, can also be applied to the first outer layer circuit pattern 130.

Meanwhile, the inner layer circuit pattern 120, the first outer layer circuit pattern 130, and the second outer layer circuit pattern 140 are a wire that transmits an electrical signal, and may be formed of a metal material having high electrical conductivity. To this end, the inner layer circuit pattern 120, the first outer layer circuit pattern 130, and the second outer layer circuit pattern 140 may be formed of at least one metal material selected from gold (Au), silver (Ag), platinum (Pt), titanium (Ti), tin (Sn), copper (Cu), and zinc (Zn). In addition, the circuit pattern 120 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the inner layer circuit pattern 120, the first outer layer circuit pattern 130, and the second outer layer circuit pattern 140 may be formed of copper (Cu) having high electrical conductivity and a relatively inexpensive price.

The inner layer circuit pattern 120, the first outer layer circuit pattern 130, and the second outer layer circuit pattern 140 may be formed by an additive process, a subtractive process, a modified semi additive process (MSAP), and a semi additive process (SAP) process, which are typical circuit board manufacturing processes, and a detailed description thereof will be omitted here.

Preferably, the first outer layer circuit pattern 130 and the second outer layer circuit pattern 140 are outermost circuit patterns disposed on the outermost side of the circuit board, and thus they may be formed by the SAP (Semi Additive Process) method.

Meanwhile, a via V may be disposed in the insulating layer 110. The vias V are disposed in each insulating layer, and thus may serve to electrically connect circuit patterns disposed in different layers to each other.

A first via V1 may be disposed in the first insulating layer 111. The first via V1 may electrically connected the first circuit pattern 121 disposed on the upper surface of the first insulating layer 111 and the second circuit pattern 122 disposed on the lower surface of the first insulating layer 111.

A second via V2 may be disposed in the second insulating layer 112. The second via V2 may be electrically connected between the first circuit pattern 121 disposed on the upper surface of the first insulating layer 111 and the third circuit pattern 123 disposed on the upper surface of the second insulating layer 112.

A third via V3 may be disposed in the third insulating layer 113. The third via V3 may be electrically connected the second circuit pattern 122 disposed on the lower surface of the first insulating layer 111 and the fourth circuit pattern 124 disposed on the lower surface of the third insulating layer 113.

A fourth via V4 may be disposed in the fourth insulating layer 114. The fourth via V4 may be electrically connected the third circuit pattern 123 disposed on the upper surface of the second insulating layer 111 and the fifth circuit pattern 125 disposed on the upper surface of the fourth insulating layer 114.

A fifth via V5 may be disposed in the fifth insulating layer 115. The fifth via V5 may be electrically connected the fourth circuit pattern 124 disposed on the lower surface of the third insulating layer 113 and the sixth circuit pattern 126 disposed on the lower surface of the fifth insulating layer 115.

A sixth via V6 may be disposed in the sixth insulating layer 116. The sixth via V6 may be electrically connected the fifth circuit pattern 125 disposed on the upper surface of the fourth insulating layer 114 and the seventh circuit pattern 127 disposed on the upper surface of the sixth insulating layer 116.

A seventh via V7 may be disposed in the seventh insulating layer 117. The seventh via V7 may be electrically connected the sixth circuit pattern 126 disposed on the lower surface of the fifth insulating layer 115 and the eighth circuit pattern 128 disposed on the lower surface of the seventh insulating layer 117.

An eighth via V1 may be disposed in the eighth insulating layer 118. The eighth via V8 may be electrically connected the seventh circuit pattern 127 disposed on the upper surface of the sixth insulating layer 116 and the second outer layer circuit pattern 140 disposed on the upper surface of the primer layer 150.

A ninth via V9 may be disposed in the ninth insulating layer 119. The ninth via V9 may be electrically connected the eighth circuit pattern 128 disposed on the lower surface of the seventh insulating layer 117 and the first outer layer circuit pattern 130 disposed on the lower surface of the ninth insulating layer 119.

The via V may be formed by filling an inside of a via hole (not shown) formed in each insulating layer with a conductive material.

The via hole may be formed by any one of mechanical, laser, and chemical processing. When the through hole is formed by machining, methods such as milling, drilling, and routing may be used, and when formed by laser processing, a UV or CO2 laser method may be used. In addition, when formed by chemical processing, a chemical containing aminosilane, ketones, or the like may be used. Accordingly, at least one of plurality of insulating layers may be opened.

Meanwhile, the laser processing is a cutting method that concentrates optical energy on a surface to melt and evaporate a part of the material to take a desired shape, accordingly, complex formations by computer programs can be easily processed, and even composite materials that are difficult to cut by other methods can be processed.

In addition, the laser processing has a cutting diameter of at least 0.005 mm, and has a wide range of possible thicknesses.

As the laser processing drill, it is preferable to use a YAG (Yttrium Aluminum Garnet) laser, a CO2 laser, or an ultraviolet (UV) laser. YAG laser is a laser that can process both copper foil layers and insulating layers, and CO2 laser is a laser that can process only insulating layers.

When the through hole is formed, the first to ninth via V1, V2, V3, V4, V5, V6, V7, V8 and V9 may be formed by filling the inside of the through hole with a conductive material. The metal material forming the first to ninth via V1, V2, V3, V4, V5, V6, V7, V8 and V9 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, inkjetting and dispensing.

Meanwhile, a protective layer may be disposed on an outermost side of the circuit board 100. Preferably, a first protective layer 160 may be disposed on the eighth insulating layer 118 (preferably, on the primer layer 150). In addition, a second protective layer 175 may be disposed under the ninth insulating layer 119.

The first protective layer 160 and the second protective layer 175 may be formed of at least one layer using any one or more of Solder Resist (SR), oxide, and Au. Preferably, the first protective layer 160 and the second protective layer 175 may be solder resist.

Meanwhile, first protective layer 160 are disposed on the primer layer 150. The first protective layer 160 may serve to protect a surface of the second outer layer circuit pattern 140 while supporting the second outer layer circuit pattern 140 disposed on the primer layer 150.

That is, the first protective layer 160 may partially overlap the second outer layer circuit pattern 140 disposed on the primer layer 150. An area of the first protective layer 160 may be smaller than an area of the eighth insulating layer 118. An area of the first protective layer 160 may be smaller than an area of the primer layer 150. The first protective layer 160 are partially or entirely disposed on the primer layer 150 and the second outer layer circuit pattern 140, and accordingly, the first protective layer may include an open region exposing the surface of the second outer layer circuit pattern 140.

The first protective layer 160 may include an open region or a first region R1 having a groove-like shape. The first region R1 may mean a region in which the surface of the second outer layer circuit pattern 140 is exposed through the first protective layer 160 among the upper region of the primer layer 150 and the second outer layer circuit pattern 140.

That is, the circuit board includes a first region R1 and a second region R2. The first region R1 is an open region in which the surface of the second outer layer circuit pattern 140 must be exposed through the first protective layer 160, and the second region R2 may be a buried region in which the surface of the second outer layer circuit pattern 140 is covered by the first protective layer 160.

That is, the first region R1 may be a non-arranged region of the first protective layer 160 for electrically connecting the second outer layer circuit pattern 140 to a component such as a chip. Accordingly, the second outer layer circuit pattern 140 disposed on the first region R1 may be exposed to the outside in a state in which a protective layer protecting the second outer layer circuit pattern 140 does not exist.

In addition, the second outer layer circuit pattern 140 disposed in the first region R1 as described above may have reliability problems such as collapsing or sweeping due to various factors. Furthermore, the second outer layer circuit pattern 140 is a fine circuit pattern, and thus has a line width of 10 μm or less and a spacing of 10 μm or less, and is disposed on the primer layer 150. Accordingly, the second outer layer circuit pattern 140 disposed on the first region R1 may easily collapse or sweep against various small external impacts.

Accordingly, the first protective layer 160 in the embodiment are also disposed on the primer layer 150 corresponding to the first region R1 in order to improve the reliability of the second outer layer circuit pattern 140 disposed on the first region R1.

That is, the first protective layer 160 may be disposed on the upper surface of the primer layer 150 in a region where the second outer layer circuit pattern 140 is not disposed. For example, the first protective layer 160 are disposed on the upper surface of the primer layer 150, and thus may be disposed between the second outer layer circuit patterns 140 on the first region R1.

In this case, the second outer layer circuit pattern 140 includes a second-first outer layer circuit pattern formed in the first region R1 and a second-second outer layer circuit pattern formed in the second region R2.

The upper surface of the primer layer 150 includes a first upper surface corresponding to the first region R1 and a second upper surface corresponding to the second region R2.

In this case, as shown in FIGS. 3 and 4, the first protective layer 160 are disposed entirely on the primer layer 150 without dividing the first region R1 and the second region R2, and may be disposed in a region between the second-first outer layer circuit patterns and a region between the second-second outer layer circuit patterns, respectively.

Accordingly, the first protective layer 160 include a first portion disposed in the first region R1 and a second portion disposed in the second region R2.

In this case, the first protective layer 160 may have different heights for each region.

For example, the first protective layer 160 may include a first portion disposed in the first region R1 and a second portion disposed in the second region R2.

In this case, the surface of the second outer layer circuit pattern 140 in the first region R1 should be exposed to the outside, and the surface of the second outer layer circuit pattern 140 in the second region R2 should be covered by a protective layer.

Accordingly, an upper surface of the first portion of the first protective layer 160 disposed in the first region R1 may be lower than an upper surface of the second outer layer circuit pattern 140. Preferably, the height or thickness of the first portion of the first protective layer 160 may be smaller than the height or thickness of the second outer layer circuit pattern 140.

Also, an upper surface of the second portion of the first protective layer 160 disposed in the second region R2 may be positioned higher than an upper surface of the second outer layer circuit pattern 140. Preferably, the height or thickness of the second portion of the first protective layer 160 may be greater than the height or thickness of the second outer layer circuit pattern 140.

Accordingly, the surface of the second outer layer circuit pattern 140 disposed in the first region R1 may be exposed to the outside due to a low height of the first protective layer 160, and the second outer layer circuit pattern 140 disposed in the second region R2 may be buried in the first protective layer 160 due to a high height of the first protective layer 160.

Hereinafter, the first protective layer 160 will be described in detail.

The first protective layer 160 may be disposed on the primer layer 150. The first protective layer 160 is a solder resist.

The first protective layer 160 may be disposed between the second outer layer circuit patterns 140 on the primer layer 150. That is, the second outer layer circuit pattern 140 may be disposed to be spaced apart from each other at a predetermined spacing on the primer layer 150, and accordingly, the first protective layer 160 may be disposed on a region of the upper surface of the primer layer 150 where the second outer layer circuit pattern 140 is not disposed Hereinafter, the first protective layer 160 will be described as a solder resist 160.

The solder resist 160 may be disposed on a region of the upper surface of the primer layer 150 where the second outer layer circuit pattern 140 is not disposed.

Accordingly, the lower surface of the solder resist 160 may directly contact the upper surface of the primer layer 150. In addition, the solder resist 160 may have a structure in direct contact with the second outer layer circuit pattern 140. For example, a side surface of the first portion of the solder resist 160 may directly contact a side surface of the second outer layer circuit pattern 140. For example, the second portion of the solder resist 160 may be disposed to cover a side surface and upper surface of the second outer layer circuit pattern 140.

In this case, the solder resist 160 may have different heights for each region.

That is, the solder resist 160 includes a first portion disposed in the first region R1 and a second portion disposed in the second region R2.

In this case, a height of the first portion of the solder resist 160 may be smaller than a height of the second outer layer circuit pattern 140. Preferably, an upper surface of the first portion of the solder resist 160 may be positioned lower than an upper surface of the second outer layer circuit pattern 140. Accordingly, a part of the side surface of the second outer layer circuit pattern 140 disposed in the first region R1 may contact the first portion of the first solder resist 160, and the remaining part of the side surface of the second outer layer circuit pattern 140 may be exposed.

Here, the first portion of the solder resist 160 is disposed surrounding the second outer layer circuit pattern 140 disposed in the first region R1, and accordingly, it is possible to perform a function of inhibiting the second outer layer circuit pattern 140 disposed in the first region R1 from collapsing or sweeping.

The solder resist 160 may use a photo solder resist film. The solder resist 160 may have a structure in which a resin and a filler are mixed.

In addition, the second portion of the solder resist 160 may be disposed while covering the second outer layer circuit pattern 140 disposed in the second region R2.

That is, the solder resist 160 may include a first portion disposed in the first region R1 and a second portion disposed in the second region R2.

In addition, the first portion of the solder resist 160 may have a first height. In addition, the second portion of the solder resist 160 may have a second height greater than the first height. In this case, the first height is smaller than the height of the second outer layer circuit pattern 140 and the second height is greater than the height of the second outer layer circuit pattern 140.

Accordingly, the first portion of the solder resist 160 having the first height may be positioned lower than the second outer layer circuit pattern 140, and the second portion of the solder resist 160 having the second height may be positioned higher than the second outer layer circuit pattern 140.

Here, the solder resist 160 may have different heights for each region, and this may be achieved by selectively removing only the first portion of the solder resist 160 disposed in the first region R1 as the solder resist 160 is exposed and developed.

Meanwhile, the solder resist 160 may include a filler such as $BaSO_4$, $SiO_2$, or Talc, and the content thereof may be 20 wt % to 35 wt %.

In this case, when the content of the filler included in the solder resist 160 is less than 20 wt %, the second outer layer circuit pattern 140 may not be stably protected by the solder resist 160. In addition, when the content of the filler included in the solder resist 160 is greater than 35 wt %, a part of the filler may remain on the second outer layer circuit pattern 140 when the first portion of the solder resist 160 is formed, and accordingly, a reliability problem occurs or a process of removing the filler must be additionally performed.

As described above, in the embodiment, by forming a solder resist layer on the uppermost insulating layer and selectively removing the first region R1 of the formed solder resist layer, the solder resist 160 having different heights for each region may be formed Accordingly, the solder resist 160 in the first region may have a height lower than that of the second outer layer circuit pattern 140 and expose a surface of the second outer layer circuit pattern 140, and the solder resist 160 in the second region may be disposed while covering the second outer layer circuit pattern 140.

Meanwhile, the second outer layer circuit pattern 140 may include a trace 141 and a pad 142 according to functions. The pad 142 may be a region in which an adhesive member (not shown) is disposed for connection with an electronic component such as a chip. In addition, the trace 141 may be a wiring line connecting different pads. Here, the pad 142 generally has a larger width than the trace, and thus the pad 142 may have a characteristic resistant to external impact. However, the trace 141 are disposed with a width and spacing corresponding to the fine circuit pattern as described above, and thus may have characteristics that are vulnerable to external impact. Accordingly, the solder resist 160 may stably support a second outer layer circuit pattern 140 disposed in the first region R1, more specifically, the trace 141 of the second outer layer circuit pattern 140 in the first region R1.

Meanwhile, as shown in FIG. 4, the second outer layer circuit pattern 140 may be disposed on the primer layer 150 with a first height H1.

In addition, the solder resist 160 may be disposed on the first solder resist 160 with different heights for each region.

The solder resist 160 may include a first portion disposed in the first region R1 and a second portion disposed in the second region R2.

In this case, an upper surface 161 of the first portion of the solder resist 160, an upper surface 162 of the second portion, and a boundary surface 163 between the first portion and the second portion may have different surface roughness. This will be described in detail above.

The first portion of the solder resist 160 may be disposed on the primer layer 150 with a second height H2. In addition, the second portion of the solder resist 160 may be disposed on the primer layer 150 with a third height H3.

In this case, the second height H2 is smaller than the first height H1. Preferably, the first portion of the solder resist 160 may be disposed on the primer layer 150 while having a height smaller than a height of the second outer layer circuit pattern 140. In this case, the second height H2 may be 70% to 90% of the first height H1. For example, when the second height H2 is smaller than 70% of the first height H1, the second outer layer circuit pattern 140 may not be stably supported by the solder resist 160. For example, when the second height H2 is smaller than 70% of the first height H1, there may be difficulties in a process of forming the solder resist 160. For example, when the second height H2 is greater than 90% of the first height H1, a part of the filler included in the solder resist 160 may remain on the second outer layer circuit pattern 140. For example, when the second height H2 is greater than 90% of the first height H1, variations in the process of forming the solder resist 160 may occur, and as a result, a problem in that the surface of the second outer layer circuit pattern 140 is covered by the solder resist 160 may occur.

Meanwhile, the third height H3 may be greater than the first height H1 and the second height H2. Preferably, the third height H3 may be 110% to 400% of the first height H1. For example, when the third height H4 is smaller than 110% of the first height H1, the surface of the second outer layer circuit pattern 140 of the second region R2 may not be stably protected by the solder resist 160. For example, when the third height H3 is greater than 400% of the first height H1, the overall thickness of the circuit board may increase.

Figure 5:
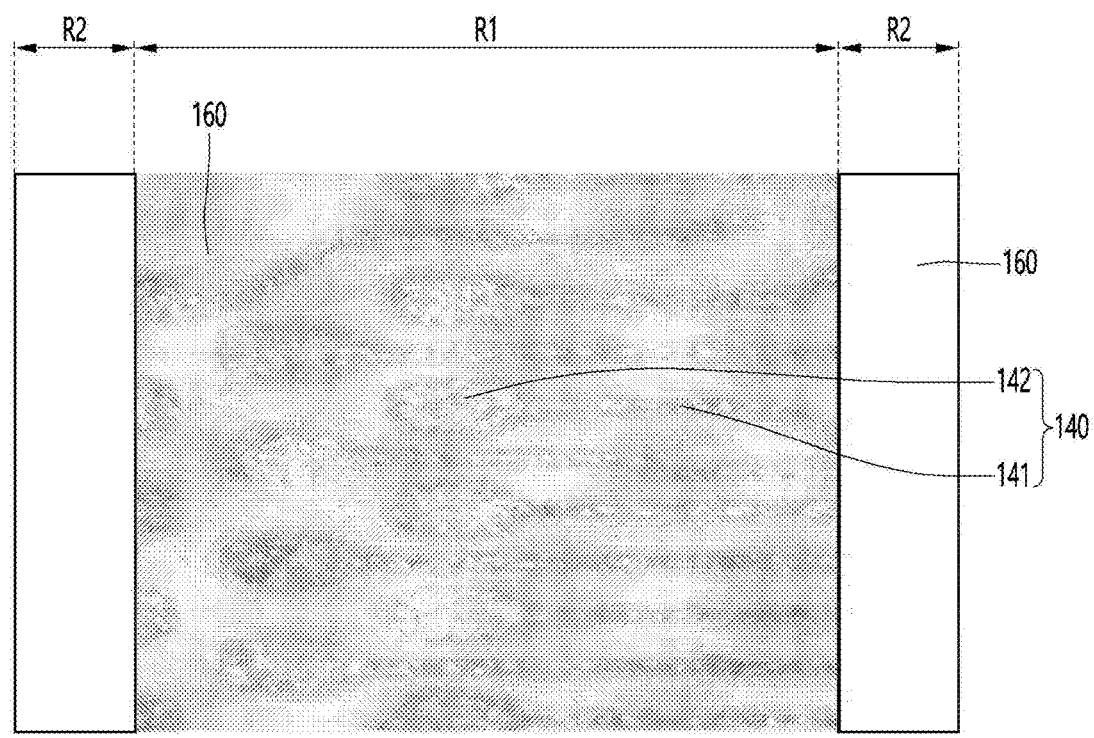
FIG. 5 is a view showing a circuit board including a protective layer according to an embodiment.

FIG. 5 is a view showing a circuit board including a protective layer according to an embodiment.

Referring to FIG. 5, it will be described for the protective layer including the solder resist 160 according to the embodiment. Here, the solder resist 160 may be a protective layer protecting the surface of the second outer layer circuit pattern 140 in the second region R2, and may be a support layer supporting the second outer layer circuit pattern 140 in the first region R1.

In this case, in the comparative example, a circuit pattern having a protruding structure is disposed on the insulating layer. In addition, the circuit pattern may be independently disposed on the insulating layer without being supported by another support layer. Accordingly, collapse or sweeping of the circuit pattern occurs in the region corresponding to the fine pattern in the comparative example.

This may occur in the circuit pattern of the outermost layer of the circuit board including the circuit pattern manufactured by the SAP method.

Unlike this, in the embodiment, the primer layer 150 is disposed on the eighth insulating layer 118, and the second outer layer circuit pattern 140 is disposed on the primer layer 150.

The solder resist 160 serving as a support layer and a protective layer is disposed on the primer layer 150 while surrounding the second outer layer circuit pattern 140.

In this case, the solder resist 160 may be disposed in the first region R1 and the second region R2. The solder resist 160 may support the second outer layer circuit pattern 140 disposed on the outermost layer of the circuit board 100, and in particular, the solder resist may support the trace 141 and the pad 142 of the second outer layer circuit pattern 140 disposed in the first region R1, and may protect the second outer layer circuit pattern 140 from external impact.

Meanwhile, as described above, the solder resist 160 in the embodiment may have different heights for each region, and may have different heights even within the same region.

That is, the solder resist 160 may have different heights depending on the density of outer layer circuit patterns disposed in a corresponding region.

In this case, the second outer layer circuit patterns 140 may be arranged with different densities for each region.

Widely, the second outer layer circuit pattern 140 may include a trace 141 and a pad 142. In addition, the pad 142 may include a core pad 142a and a BGA pad 142b.

The first region R1 and the second region R2 may be divided into a first partial region where the trace 141 is disposed, a second partial region where the core pad 142a is disposed, and a third partial region where the BGA pad 142b is disposed.

In this case, the outer layer circuit pattern having different densities may be disposed in the first to third partial regions.

In this case, a density of the outer layer circuit pattern in the first partial region may be smaller than a density of the outer layer circuit pattern in the second partial region. In addition, a density of the outer layer circuit pattern in the second partial region may be smaller than a density of the outer layer circuit pattern in the third partial region.

Accordingly, the height of the solder resist in each partial region may be different depending on the density of the outer layer circuit pattern. That is, in a partial region having a low density of the outer layer circuit pattern, a region where the outer layer circuit pattern is not disposed may be filled with the solder resist 160, and accordingly, a height of the solder resist 160 may be relatively low compared to other partial regions. In addition, in a partial region having a high density of the outer layer circuit pattern, the height of the solder resist 160 may be relatively high compared to other partial regions.

Accordingly, the first region R1 may include a first-first partial region, a first-second partial region, and a first-third partial region. Also, the first-first partial region, the first-second partial region, and the first-third partial region may have different heights. Preferably, the first-first partial region, the first-second partial region, and the first-third partial region may have different heights while having a higher height than the second outer layer circuit pattern 140.

In addition, the second region R2 may include a second-first partial region, a second-second partial region, and a second-third partial region. Also, the second-second partial region, the second-second partial region, and the second-third partial region may have different heights. Preferably, the second-first partial region, the second-second partial region, and the second-third partial region may have different heights while having a higher height than the second outer layer circuit pattern 140.

Figure 6A:
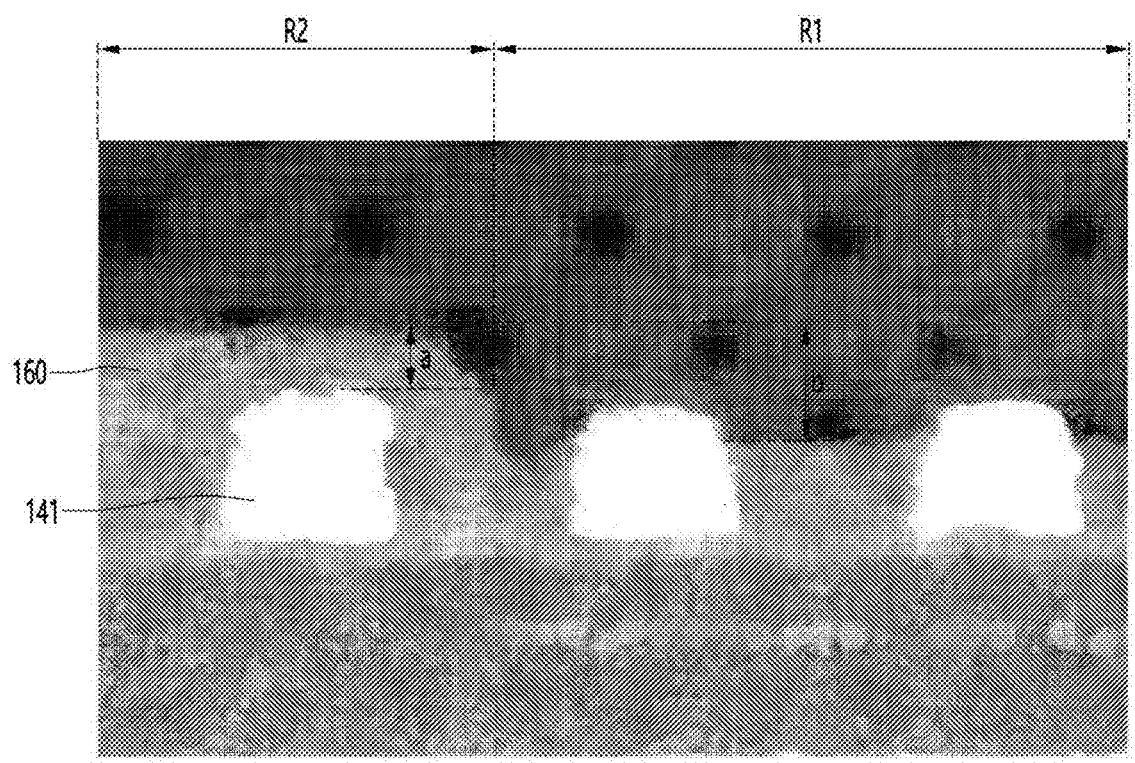
FIG. 6A is a view showing a height of a solder resist in a first partial region according to an embodiment.
Figure 6B:
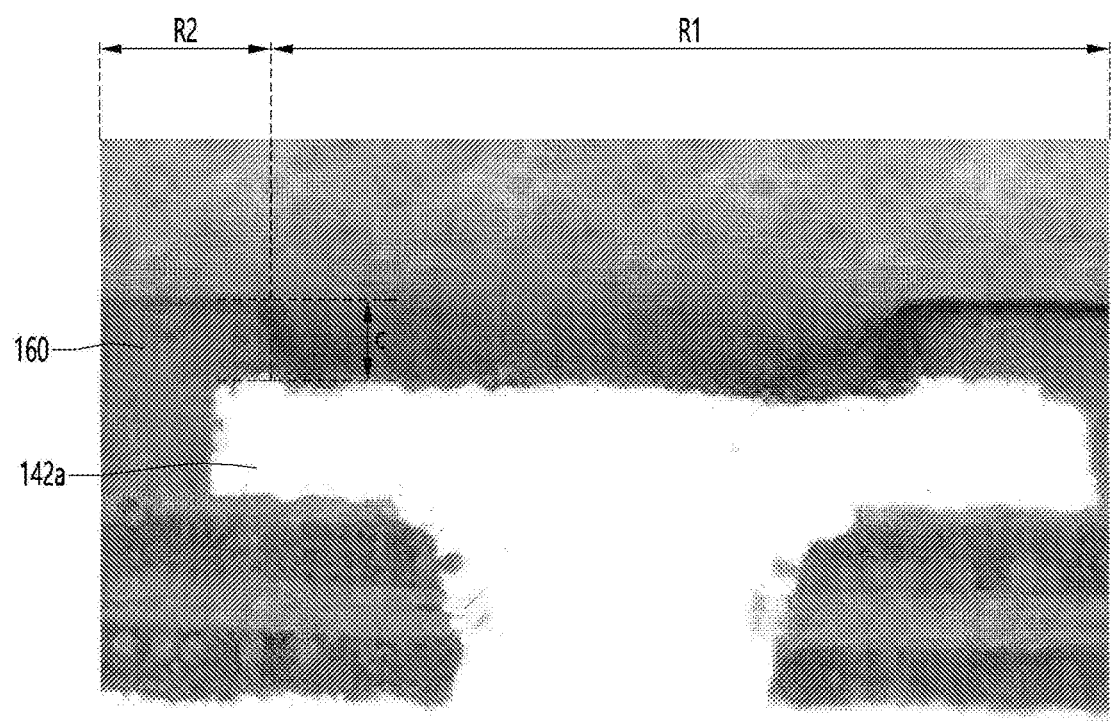
FIG. 6B is a view showing a height of a solder resist in a second partial region according to an embodiment.
Figure 6C:
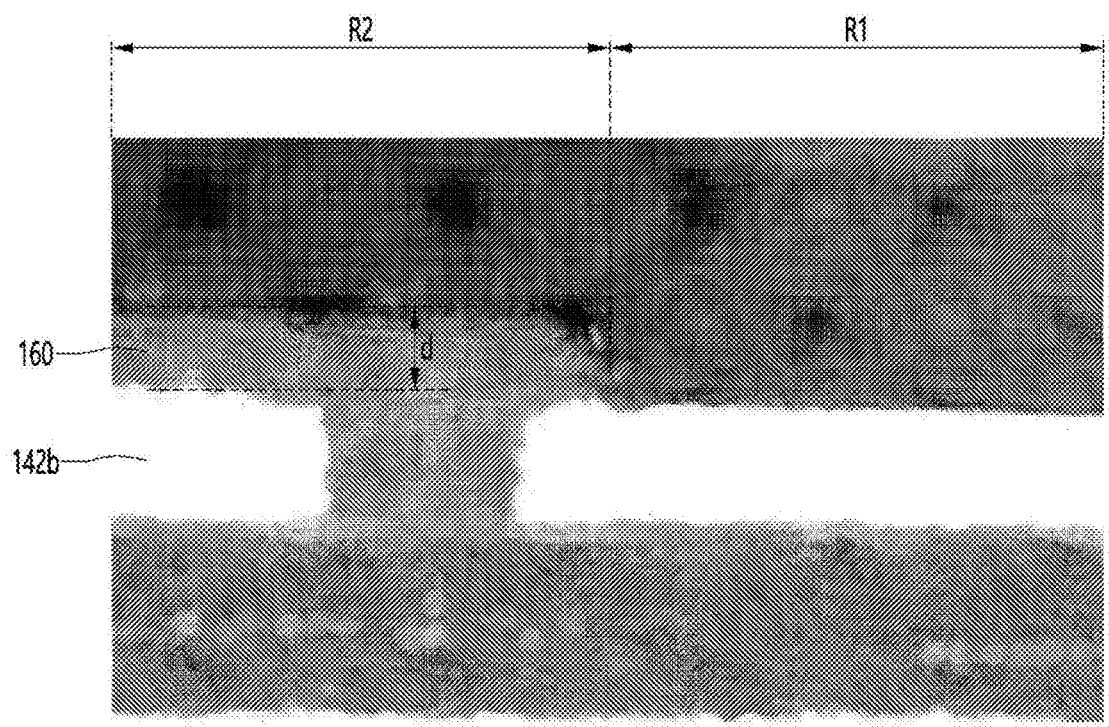
FIG. 6C is a view showing a height of a solder resist in a third partial region according to an embodiment.

FIG. 6A is a view showing a height of a solder resist in a first partial region according to an embodiment, FIG. 6B is a view showing a height of a solder resist in a second partial region according to an embodiment, and FIG. 6C is a view showing a height of a solder resist in a third partial region according to an embodiment.

Referring to FIG. 6A, the solder resist 160 are respectively disposed in the first region R1 and the second region R2. In addition, the solder resist 160 may be disposed in different partial regions in the first region R1 and the second region R2, respectively. The partial region may include a first partial region where the trace 141 is disposed.

In this case, the trace 141 includes patterns having a narrow line width. Accordingly, the pattern density of the first partial region where the trace 141 is disposed is relatively low compared to other partial regions.

In addition, among the second portions of the solder resist 160, the second-first portion disposed in the second-first partial region where the trace 141 is disposed may protrude from the upper surface of the second outer layer circuit pattern 140 by a first height (a).

In addition, in the second portion of the solder resist 160, the first-first portion disposed in the first-first partial region where the trace 141 is disposed may be lower than the height of the second-first portion by a second height (b).

Referring to FIG. 6B, the solder resist 160 is disposed in the first region R1 and the second region R2, respectively. In addition, the solder resist 160 may be disposed in different partial regions in the first region R1 and the second region R2, respectively. The partial region may include a second partial region in which the core pad 142a is disposed.

In this case, the core pad 142a includes patterns having a larger line width than the trace 141. Accordingly, the pattern density of the second partial region where the core pad 142a is disposed is relatively higher than that of the partial region where the trace 141 is disposed.

Among the second portions of the solder resist 160, the second-second portion disposed in the second-second partial region where the core pad 142a is disposed may protrude from the upper surface of the second outer layer circuit pattern 140 by a third height (c).

Referring to FIG. 6C, the solder resist 160 is disposed in the first region R1 and the second region R2, respectively. In addition, the solder resist 160 may be disposed in different partial regions in the first region R1 and the second region R2, respectively. The partial region may include a third partial region in which the BGA pad 142b is disposed.

In this case, the BGA pad 142b includes patterns having a larger line width than the core pad 142a. Accordingly, the pattern density of the third partial region where the BGA pad 142b is disposed is relatively higher than that of the partial region where the core pad 142a is disposed.

Among the second portion of the solder resist 160, the second-third partial region disposed in the second-third partial region where the BGA pad 142b is disposed may protrude from the upper surface of the second outer layer circuit pattern 140 by a fourth height (d).

In this case, the first height (a) is smaller than the third height (c). In addition, the third height (c) is smaller than the fourth height (d).

Therefore, the first portion of the solder resist 160 disposed in the first region R1 may have the highest height in the first-third partial region, and may have the lowest height in the first-first partial region.

In addition, the second portion of the solder resist 160 disposed in the second region R2 may have the highest height in the second-third partial region, and may have the lowest height in the second-first partial region.

Table 1 shows the height difference as above.

TABLE 1

|  | trace | Core pad | BGA pad |
| --- | --- | --- | --- |
| Protruding height in the second region | 8~9 μm | 11~12 μm | 12~14 μm |
| Height difference between the first region and the second region | 12-13 μm | 12~13 μm | 12~13 μm |

That is, the second portion of the solder resist 160 disposed in the second region R2 may be divided into three partial regions in which the trace 141, the core pad 142a, and the BGA pad 142b are disposed.

Also, in the second portion of the solder resist 160, the height of the partial region where the trace 141 is disposed may be 8 to 9 μm, and the height of the partial region where the core pad 142a is disposed may be 11 to 12 μm, the height of the partial region where the BGA pad 142b is disposed may be 12 to 14 μm. Here, the height of the partial region means the height of the portion protruding from the upper surface of the second outer layer circuit pattern 140.

In addition, the first portion of the solder resist 160 disposed in the first region R1 may be divided into three partial regions in which the trace 141, the core pad 142a, and the BGA pad 142b are disposed.

Further, in the first portion of the solder resist 160, the height of the partial region where the trace 141 is disposed, the height of the partial region where the core pad 142a is disposed, and the height of the partial region where the BGA pad 142b is disposed may be smaller than the height of the protrusion in the second region R2 by 12 to 13 μm.

Meanwhile, the solder resist 160 in the embodiment may have different surface roughness for each region.

The solder resist 160 may include a first upper surface 161 of a first portion disposed in the first region R1, a second upper surface 162 of a second portion disposed in the second region R2, and a boundary side surface 163 between the first upper surface 161 and the second upper surface 162.

In addition, the first upper surface 161, the second upper surface 162, and the boundary side surface 163 may each have different surface roughness.

Figure 7:
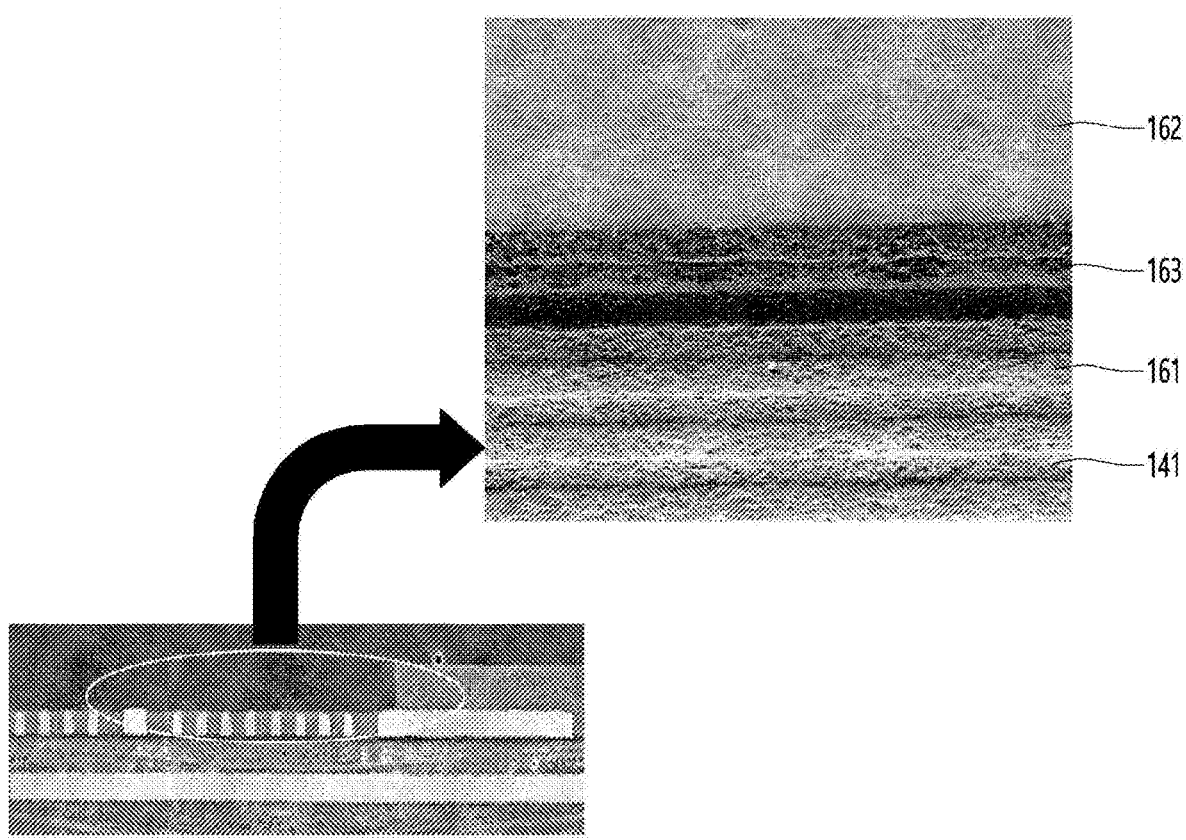
FIG. 7 is a view showing surface roughness of a solder resist according to an embodiment.

FIG. 7 is a view showing surface roughness of a solder resist according to an embodiment.

Referring to FIG. 7, a solder resist 160 according to an embodiment includes a first upper surface 161, a second upper surface 162, and a boundary side surface 163.

In addition, a center line surface roughness (Ra) of the first upper surface 161, a center line surface roughness (Ra) of the second upper surface 162, and a center line surface roughness (Ra) of the boundary side surface 163 may be different from each other.

The first upper surface 161 is a surface thinned by a developing solution after exposure and development processes are performed. And, the second upper surface 162 is a surface hardened by exposure. Also, the boundary side surface 163 is a surface that has been swollen and removed by a developing solution.

Accordingly, the center line surface roughness (Ra) of the first upper surface 161 may be 1.0 μm or more.

In addition, the center line surface roughness (Ra) of the second upper surface 162 may have a range of 0.01 to 0.1 μm.

In addition, the center line surface roughness (Ra) of the boundary side surface 163 may have a range of 0.1 to 0.5 μm.

In addition, the center line surface roughness (Ra) of the surface of the trace 141 of the second outer layer circuit pattern 140 may have a range of 0.5 μm to 1.0 μm.

As described above, in the embodiment, the center line surface roughness (Ra) of each of the first upper surface 161, the second upper surface 162, the boundary side surface 163, and the trace 141 of the solder resist 160 may different from each other.

Figure 8A:
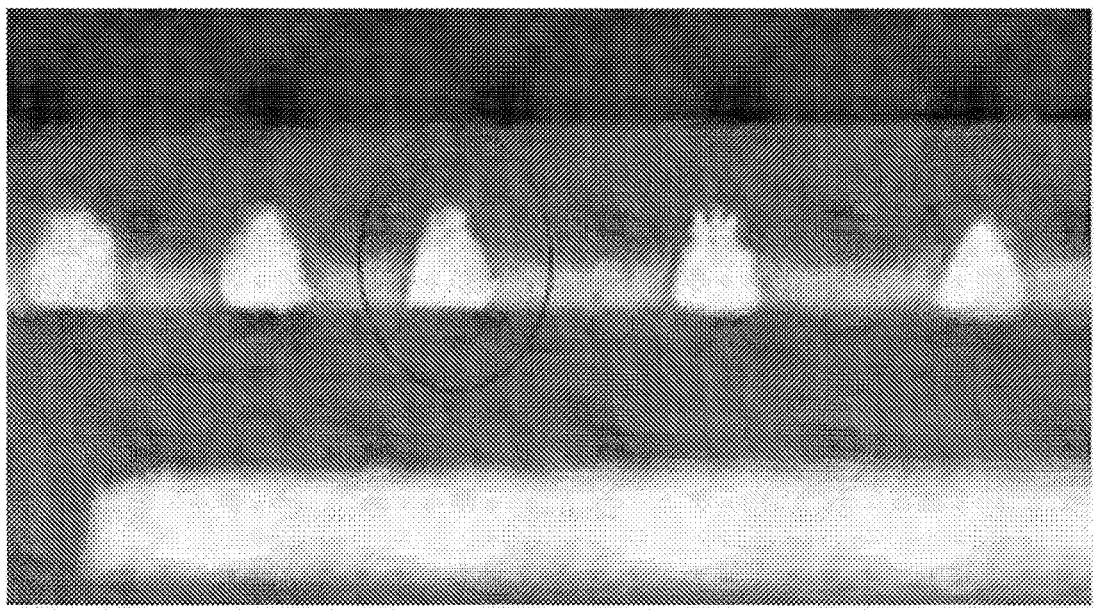
FIG. 8A is a view showing an outer layer circuit pattern according to a comparative example.
Figure 8B:
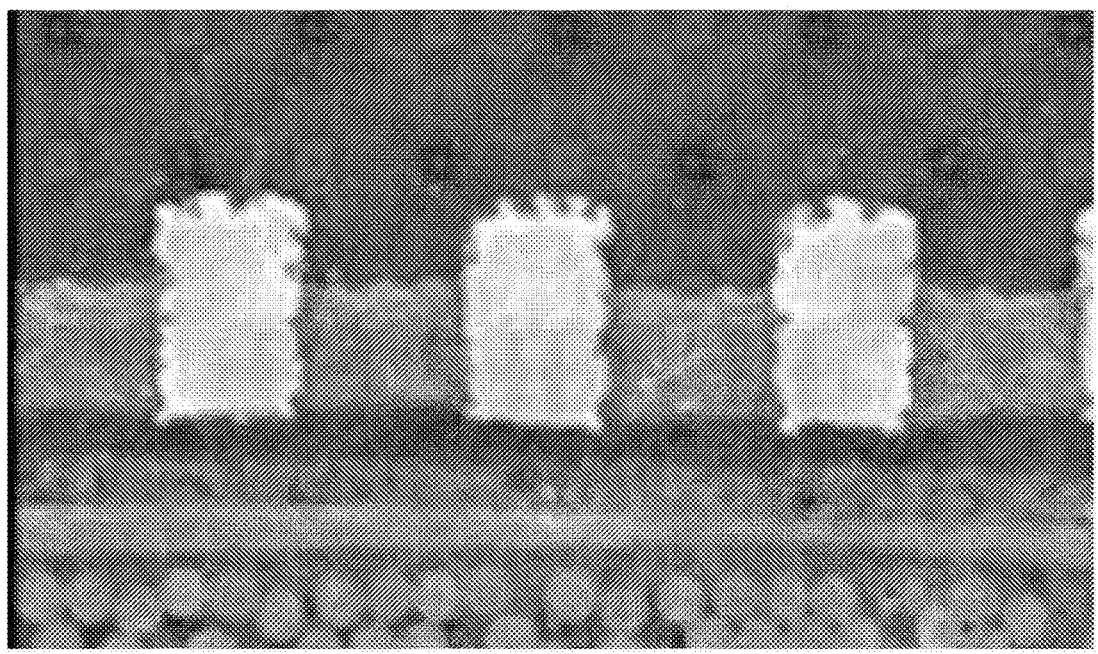
FIG. 8B is a view showing a second outer layer circuit pattern according to an embodiment.

FIG. 8A is a view showing an outer layer circuit pattern according to a comparative example, and FIG. 8B is a view showing a second outer layer circuit pattern according to an embodiment.

Meanwhile, in forming the protective layer, various methods may be used to remove a portion of the protective layer in the first region R1. For example, a portion of the protective layer may be removed by a physical method or a chemical method. For example, the protective layer may be removed by a method such as plasma or sand blasting.

However, as shown in FIG. 6A, when the protective layer is physically or chemically removed, the circuit pattern is also removed during the process of removing the protective layer, so that the circuit pattern is deformed. For example, the circuit pattern may have a triangular cross-section as a part of the circuit pattern is removed together in the process of removing the protective layer. In addition, when the upper portion of the circuit pattern has a triangular shape, an adhesive member such as a solder ball cannot be stably seated on the circuit pattern, and thus a reliability problem may occur. In addition, expensive equipment is required in order to remove the protective layer by the physical or chemical method, and thus manufacturing cost may increase.

On the other hand, in the embodiment as shown in FIG. 6B, the solder resist 160 may be removed to have a desired height for each region by using an exposure and development process to remove the solder resist 160. In addition, deformation of the second outer layer circuit pattern 140 does not occur during the exposure and development process, and the cross-sectional shape of the second outer layer circuit pattern 140 may maintain a rectangular shape.

FIGS. 9 to 15 are views showing the manufacturing method of the circuit board shown in FIG. 2 in order of process.

Figure 9:
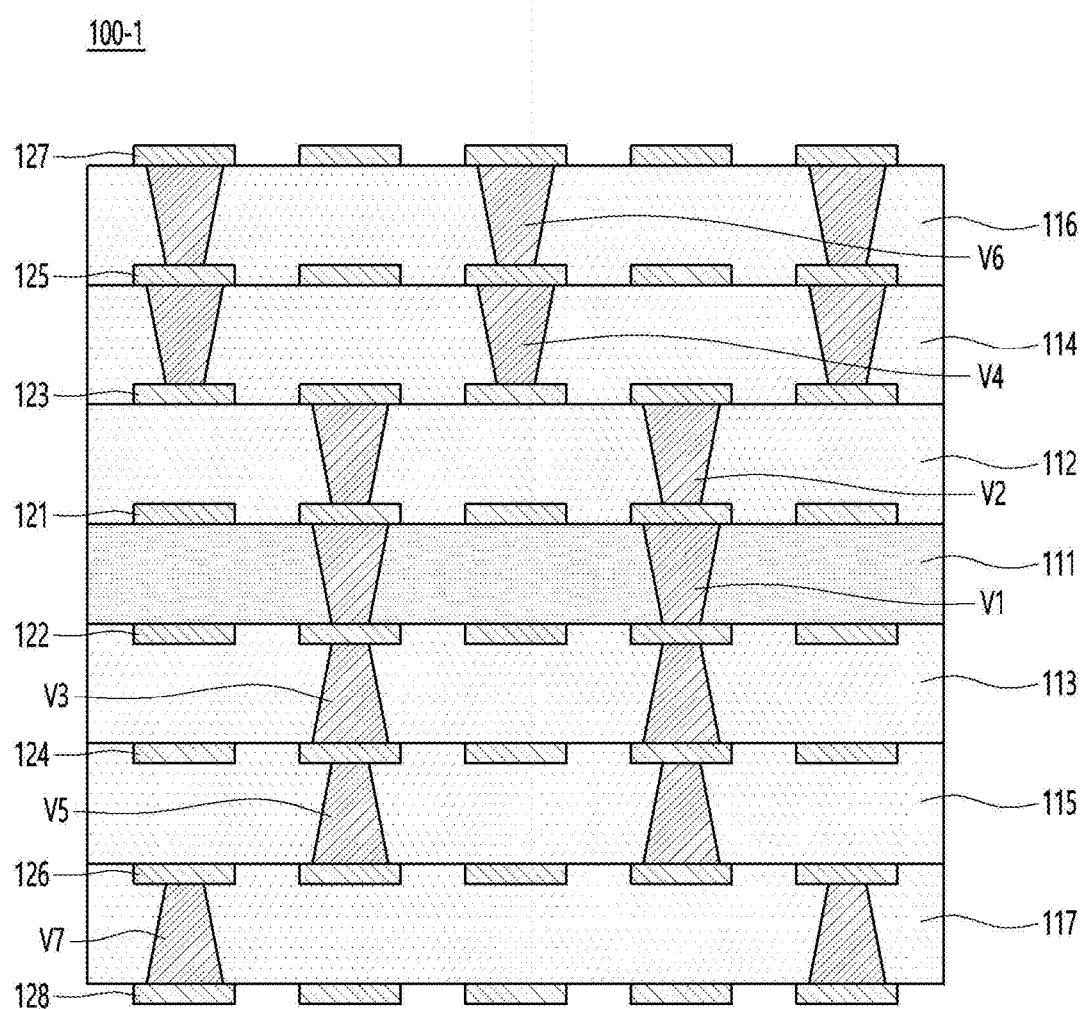
FIGS. 9 to 15 are views showing the manufacturing method of the circuit board shown in FIG. 2 in order of process.

Referring to FIG. 9, the embodiment may preferentially proceed with a process of manufacturing an inner layer substrate 100-1 for manufacturing an inner portion of the circuit board 100.

A process for manufacturing the inner layer substrate 100-1 will be briefly described.

The inner layer substrate 100-1 may include one insulating layer or, alternatively, a plurality of insulating layers.

In FIG. 9, the inner-layer substrate 100-1 is illustrated as having a seven-layer insulating layer structure, but is not limited thereto. For example, the inner-layer substrate 100-1 may include fewer than seven insulating layers, or alternatively, more than seven insulating layers.

The inner layer substrate 100-1 may include the remaining insulating layers other than the insulating layer disposed on the outermost layer of the circuit board 100. For example, the inner layer substrate 100-1 may include an insulating layer disposed on the uppermost portion of the circuit board 100 and other insulating layers excluding the insulating layer disposed on the lowermost portion of the circuit board 100.

Briefly describing the process of manufacturing the inner layer substrate 100-1, the first insulating layer 111 is firstly prepared.

And, when the first insulating layer 111 is prepared, a first via (V1) is formed in the first insulating layer (111), and a first circuit pattern 121 and a second circuit pattern 122 are respectively formed on the upper and lower surfaces of the first insulating layer 111.

Thereafter, a second insulating layer 112 is formed on the first insulating layer 111, and a third insulating layer 113 is formed under the first insulating layer 111.

Next, a second via V2 is formed in the second insulating layer 112, and a third circuit pattern 123 is formed on the upper surface of the second insulating layer 112. In addition, a third via V3 is formed in the third insulating layer 113, and a fourth circuit pattern 124 is formed under the lower surface of the third insulating layer 113.

Thereafter, a fourth insulating layer 114 is formed on the second insulating layer 112, and a fifth insulating layer 115 is formed under the third insulating layer 113.

Next, a fourth via V4 is formed in the fourth insulating layer 114, and a fifth circuit pattern 125 is formed on the upper surface of the fourth insulating layer 114. In addition, a fifth via V5 is formed in the fifth insulating layer 115, and a sixth circuit pattern 126 is formed under the lower surface of the fifth insulating layer 115.

Thereafter, a sixth insulating layer 116 is formed on the fourth insulating layer 114, and a seventh insulating layer 117 is formed under the fifth insulating layer 115.

Next, a sixth via V6 is formed in the sixth insulating layer 116, and a seventh circuit pattern 127 is formed on the upper surface of the sixth insulating layer 116. In addition, a seventh via V7 is formed in the seventh insulating layer 117, and an eighth circuit pattern 128 is formed under the lower surface of the seventh insulating layer 117.

Since the process of manufacturing the inner layer substrate 100-1 is a known technique in the art to which the present invention pertains, a detailed description thereof will be omitted.

Figure 10:
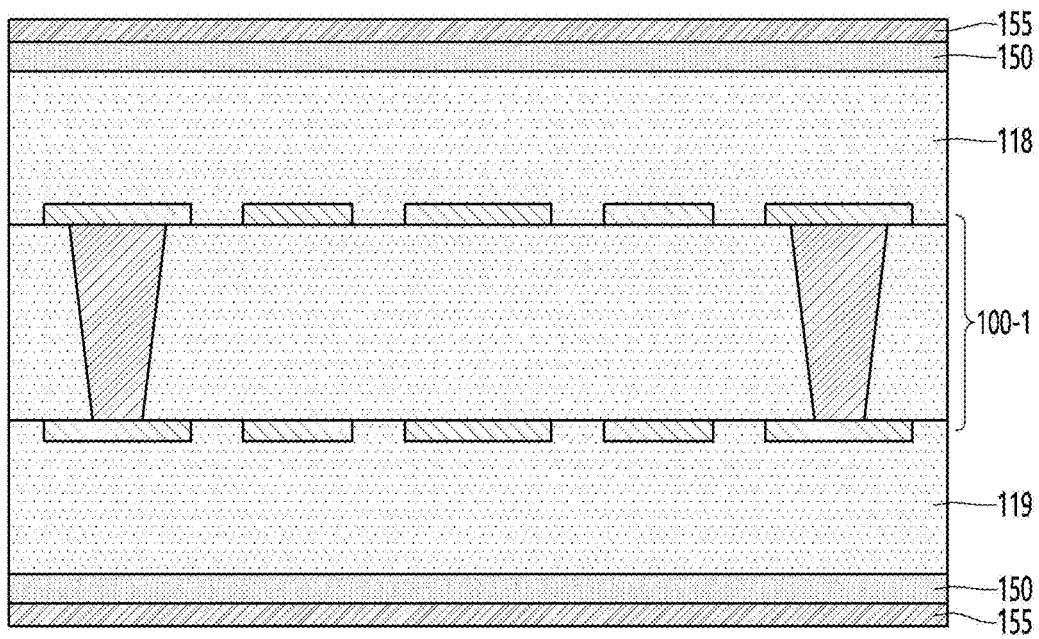

Referring to FIG. 10, when the inner layer substrate 100-1 is manufactured, an eighth insulating layer 118 corresponding to the first outermost insulating layer is formed on the upper surface of the inner layer substrate 100-1. In addition, a ninth insulating layer 119 corresponding to the second outermost insulating layer is formed under the lower surface of the inner layer substrate 100-1.

In this case, when the eighth insulating layer 118 and the ninth insulating layer 119 are laminated, a primer layer 150 is disposed on each of the upper surface of the eighth insulating layer 118 and the lower surface of the ninth insulating layer 119, and a metal layer 155 may be disposed on the primer layer 150. The metal layer 155 may serve to planarize the eighth insulating layer 118 and the ninth insulating layer 119 to have uniform heights. For example, the metal layer 155 may be disposed to improve the laminating reliability of the eighth insulating layer 118 and the ninth insulating layer 119.

The primer layer 150 may serve to increase bonding strength between each of the eighth insulating layer 118 and ninth insulating layer 119 and the first outer layer circuit pattern 130 and the second outer layer circuit pattern 140 to be disposed thereunder and thereon. That is, when the first outer layer circuit pattern 130 and the second outer layer circuit pattern 140 are disposed without the primer layer 150, since the bonding force between the eighth insulating layer 118 and the second outer layer circuit pattern 140 is low, they may be separated from each other.

Meanwhile, although FIG. 10 illustrates that the primer layer 150 is disposed on the upper surface of the eighth insulating layer 118 and the lower surface of the ninth insulating layer 119, respectively, the present invention is not limited thereto. For example, the primer layer 150 may be selectively disposed on the surface of the insulating layer on which the fine circuit pattern is to be disposed. That is, when only the first outer layer circuit pattern 130 is a fine circuit pattern, the primer layer 150 may be disposed only on the lower surface of the ninth insulating layer 119. In addition, when only the second outer layer circuit pattern 140 is a fine circuit pattern, the primer layer 150 may be disposed only on the upper surface of the eighth insulating layer 118. In addition, when the first outer layer circuit pattern 130 and the second outer layer circuit pattern 140 are both fine circuit patterns, the primer layer 150 may be disposed on both the upper surface of the eighth insulating layer 118 and the lower surface of the ninth insulating layer 119.

Figure 11:
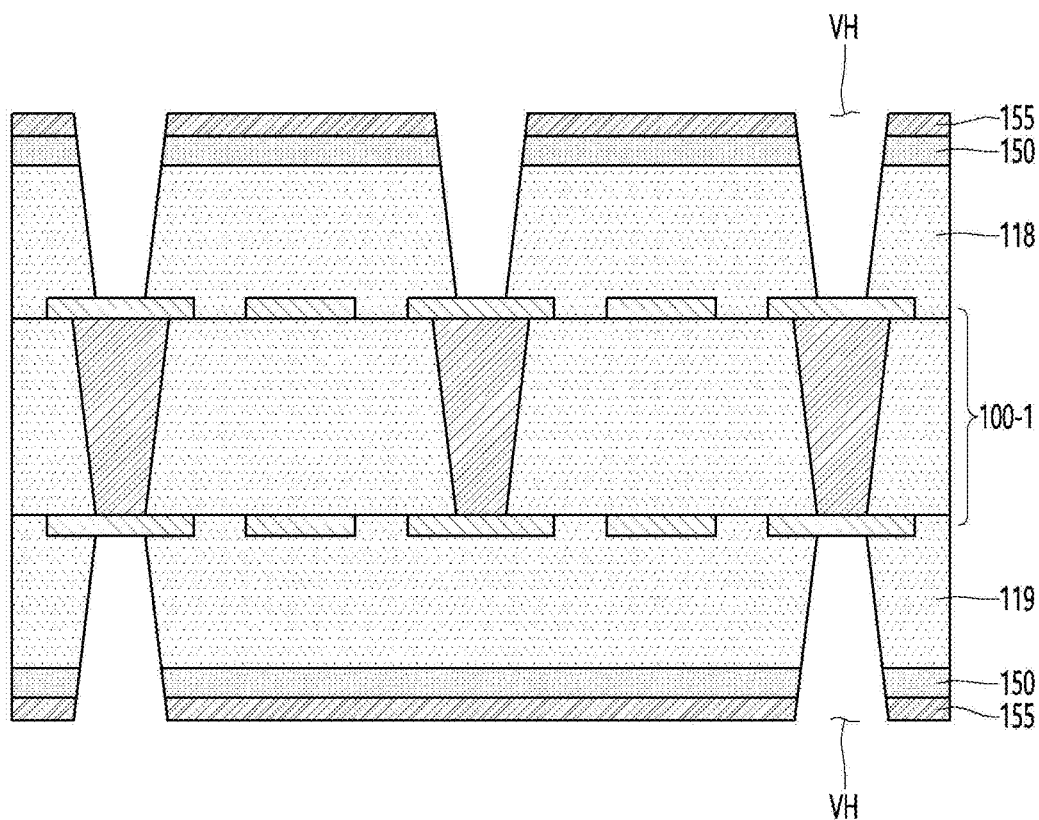

Referring to FIG. 11, when the eighth insulating layer 118 and the ninth insulating layer 119 are disposed, a via hole VH is formed in each of the eighth insulating layer 118 and the ninth insulating layer 119. In this case, the via hole VH may be formed not only in the eighth insulating layer 118 and the ninth insulating layer 119, but also in the primer layer 150 and the metal layer 155, respectively.

Figure 12:
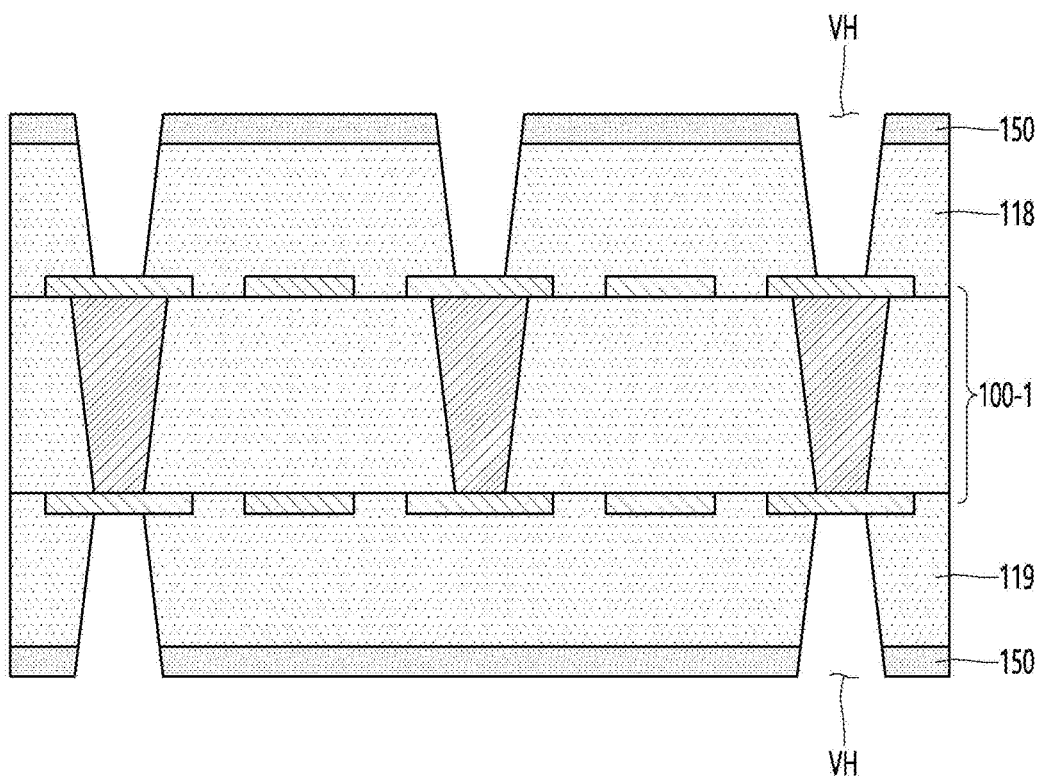

Next, referring to FIG. 12, when the via hole VH is formed, an etching process of removing the metal layer 155 disposed on the primer layer 150 may be performed. For example, a flash etching process may be performed to remove the metal layer 155 after the via hole VH is formed, and thus a process for exposing the surface of the primer layer 150 may be performed.

Figure 13:
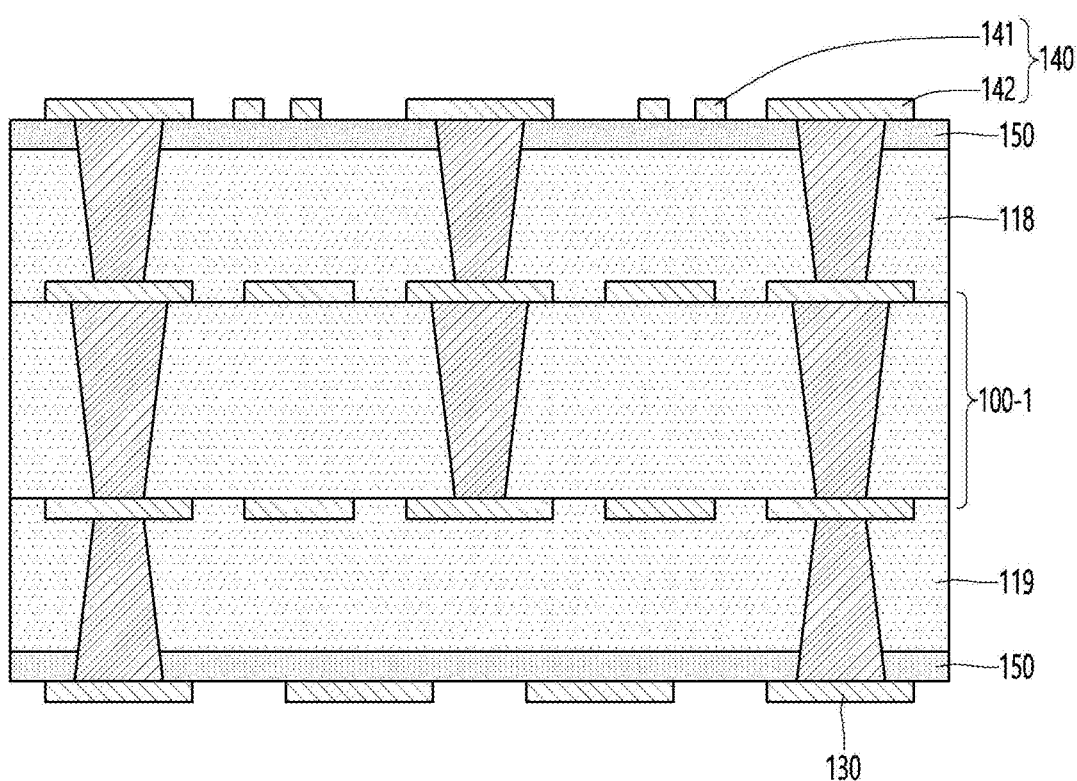

Next, referring to FIG. 13, a via (V) forming process for filling the via hole (VH) may be performed. Accordingly, the second outer layer circuit pattern 140 is formed on the upper surface of the eighth insulating layer 118, the first outer layer circuit pattern 130 may be formed on the lower surface of the ninth insulating layer 119. In this case, in the embodiment, the first outer layer circuit pattern 130 is illustrated as a general circuit pattern rather than a fine circuit pattern. However, the present invention is not limited thereto, and the first outer layer circuit pattern 130 together with the second outer layer circuit pattern may be a fine circuit pattern. Accordingly, when the first outer layer circuit pattern 130 is a general circuit pattern, the primer layer 150 between the ninth insulating layer 119 and the first outer layer circuit pattern 130 may be omitted.

A second outer layer circuit pattern 140 is disposed on the upper surface of the eighth insulating layer 118. In this case, the second outer layer circuit pattern 140 disposed on the upper surface of the eighth insulating layer 118 may include a portion disposed in the open region R1 of the first protective layer 160 and a portion disposed in the arrangement region R2 of the first protective layer 160. In addition, each of the above portions may include a trace 141 which is a wiring line for signal transmission and a pad 142 corresponding to an end of the trace 141 and to which a component is to be attached.

Figure 14:
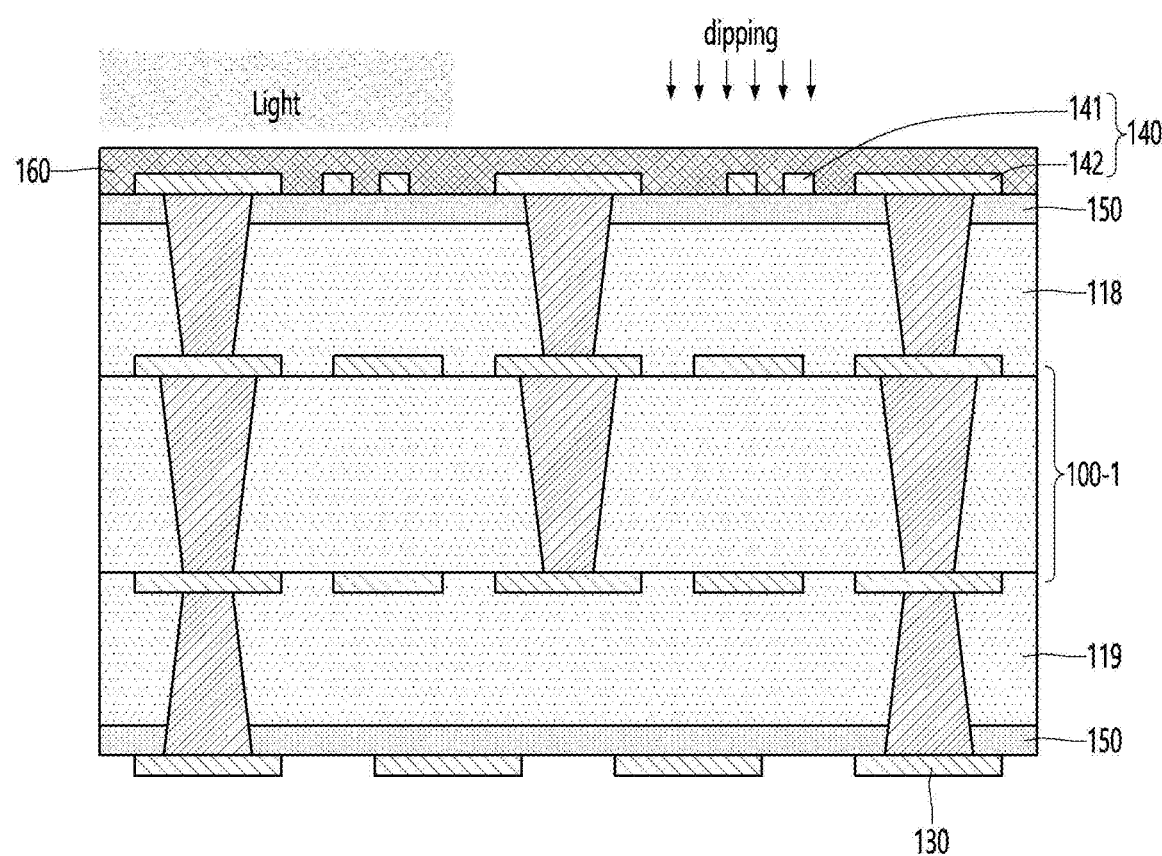

Next, referring to FIG. 14, a solder resist layer is disposed on the primer layer 150 to cover the second outer layer circuit pattern 140. In this case, the formed solder resist layer may be disposed in both the first region R1 and the second region R2 and may be formed to have a height greater than the height of the second outer layer circuit pattern 140.

After the solder resist layer is formed, exposure and development processes may be performed on the solder resist layer to form the solder resist 160 having different heights for each region. Preferably, in the embodiment, a process of exposing the second region R2 of the solder resist layer and developing the first region R1 of the solder resist layer may be performed.

To this end, UV exposure is performed by masking only the desired region on the solder resist layer, and then, by dipping the unexposed region to an organic alkaline compound containing tetramethylammonium hydroxide (TMAH) or trimethyl-2-hydroxyethylammonium hydroxide (choline), the solder resist 160 may be formed by performing a process of adjusting the height of the solder resist layer.

Figure 15:
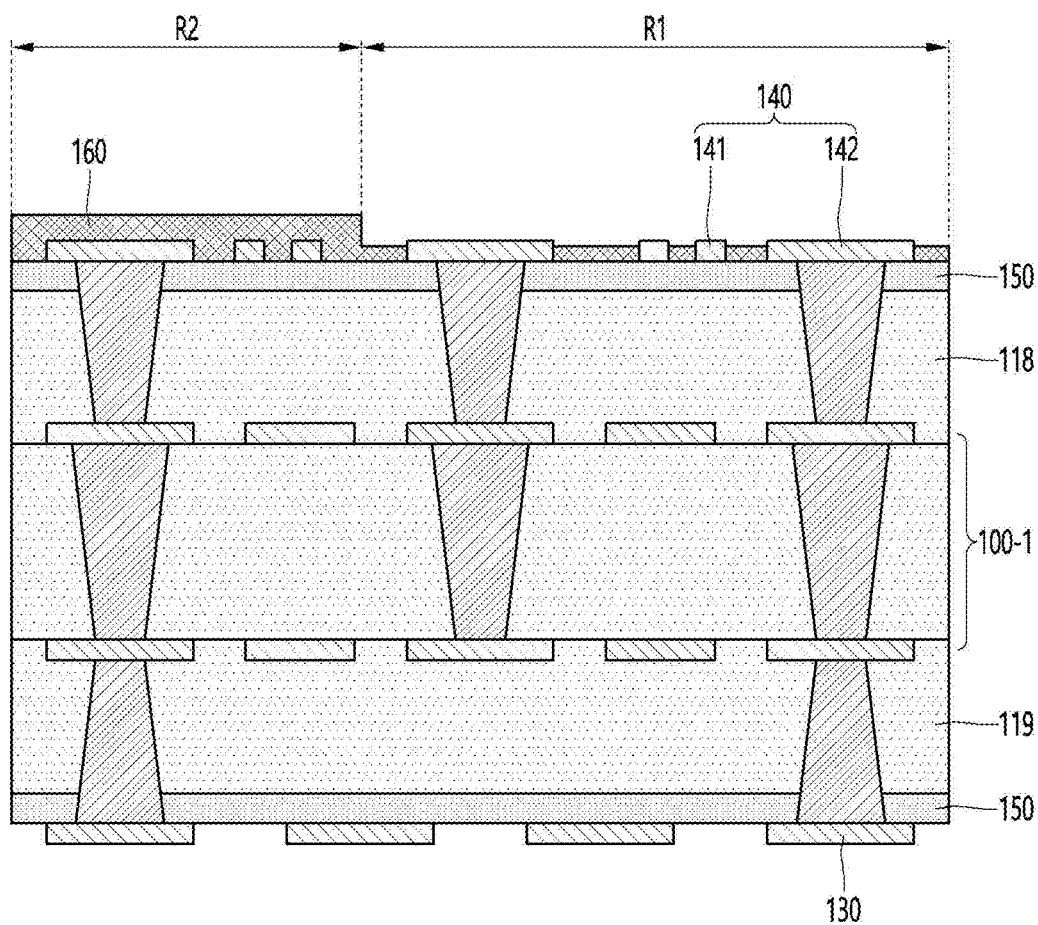

In addition, referring to FIG. 15, as the above process proceeds, the solder resist 160 may be formed with a height lower than the height of the second outer layer circuit pattern 140 in the first region R1, and may be formed with a height higher than the height of the second outer layer circuit pattern 140 in the second region R2.

Meanwhile, in the embodiment, a package substrate may be manufactured using the circuit board described above.

For example, an adhesive part (not shown) may be disposed on the second outer layer circuit pattern 140 of the circuit board. In addition, a chip may be disposed on the adhesive part.

For example, a plurality of second outer layer circuit patterns 140 may be formed spaced apart in a width direction, and a plurality of chips may be mounted on the plurality of second outer layer circuit patterns.

For example, any one of a central processor (eg, CPU), a graphics processor (eg, GPU), a digital signal processor, a cryptographic processor, a microprocessor, and a microcontroller may be mounted on the second outer layer circuit pattern 140.

For example, at least two different chips among a central processor (eg, CPU), a graphic processor (eg, GPU), a digital signal processor, a cryptographic processor, a microprocessor, and a microcontroller may be mounted on the first pad.

The circuit board in this embodiment is a circuit board having a multilayer structure of 8 or more layers, and includes an outer layer circuit pattern disposed on an uppermost outer insulating layer of the multilayers and protruding from the surface of the outer insulating layer. In this case, the outer layer circuit pattern includes a second-first circuit pattern disposed in a second region in which a solder resist (SR) is disposed among an upper region of the outer insulating layer, and a second-second circuit pattern disposed in a first region that is an open region where the solder resist is not disposed. In this case, the second-first circuit pattern may be supported by being surrounded by the solder resist, but since the second-second circuit pattern does not have a support layer capable of supporting the second-first circuit pattern, it may easily collapse due to various factors.

Accordingly, a support layer capable of supporting the second-second circuit pattern in the embodiment is formed on an outer insulating layer. In this case, the support layer in the embodiment may be implemented with a solder resist. Preferably, the solder resist of the embodiment is disposed between a plurality of second-second circuit patterns while covering the second-first circuit pattern and exposing the second-second circuit pattern.

Accordingly, the embodiment can solve problems such as collapsing or abrasion of the protruded outer layer circuit pattern by miniaturization of the outer layer circuit pattern, and thus product reliability can be improved. In particular, the embodiment can solve problems such as collapsing or rubbing of the outer layer circuit pattern in the first region, thereby improving product reliability.

In addition, when removing the solder resist of the embodiment, they are removed using an exposure and development method rather than a sand blast or plasma method. In this case, when removing the solder resist using a sandblasting or plasma method, the outer layer circuit pattern may be deformed, and in some cases, a cross-section of the outer layer circuit pattern may have a triangular shape. And, when the cross section of the outer layer circuit pattern has a triangle, an adhesive member may not be stably disposed on the outer layer circuit pattern, and thus a reliability problem may occur. In contrast, the solder resist in the embodiment may be removed without deformation of the outer layer circuit pattern, and thus reliability may be improved.

In addition, the circuit board of the embodiment can be applied to a 5G communication system, and thus, it is possible to further improve reliability by minimizing transmission loss at high frequencies. Specifically, the circuit board in the embodiment can be used at a high frequency and can reduce propagation loss.

The characteristics, structures and effects described in the embodiments above are included in at least one embodiment but are not limited to one embodiment. Furthermore, the characteristics, structures, effects, and the like illustrated in each of the embodiments may be combined or modified even with respect to other embodiments by those of ordinary skill in the art to which the embodiments pertain. Thus, it would be construed that contents related to such a combination and such a modification are included in the scope of the embodiments.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the present invention defined in the appended claims.

The invention claimed is:

1. A circuit board comprising:
an insulating structure including a plurality of insulating layers stacked along a vertical direction;
a primer layer disposed in the insulating structure;
a circuit pattern disposed on the primer layer;
a via electrode disposed on a lower surface of the circuit pattern; and
a protective layer disposed on the circuit pattern and the primer layer,
wherein the protective layer includes a first portion having a first thickness along the vertical direction and a second portion having a second thickness greater than the first thickness along the vertical direction,
wherein the primer layer has a third thickness smaller than the second thickness of the protective layer along the vertical direction,
wherein the circuit pattern includes a plurality of pad portions disposed on the primer layer and penetrating the first portion of the protective layer along the vertical direction, and
wherein the via electrode includes a plurality of vias penetrating the primer layer and at least a portion of the insulating structure along the vertical direction and being in contact with a lower surface of each of the plurality of pad portions.

2. The circuit board of claim 1, wherein the via electrode includes a side surface having an inclination angle that decreases along the vertical direction, and
wherein the side surface of the via electrode includes a first side surface in contact with an inner wall of the primer layer, and a second side surface disposed below the first side surface and in contact with an inner wall of the insulating structure.

3. The circuit board of claim 1, wherein the third thickness of the primer layer is smaller than a thickness of each of the plurality of insulating layers of the insulating structure.

4. The circuit board of claim 1, wherein the pad portion has a fourth thickness greater than the first thickness and protrudes onto the first portion of the protective layer.

5. The circuit board of claim 4, wherein the fourth thickness is 70% to 90% of the first thickness.

6. The circuit board of claim 5, wherein the protective layer includes a first upper surface of the first portion, a second upper surface of the second portion, and a boundary surface between the first upper surface and the second upper surface, and
wherein a surface roughness of the first upper surface, a surface roughness of the second upper surface, and a surface roughness of the boundary surface are different from one another.

7. The circuit board of claim 6, wherein a centerline surface roughness (Ra) of the first upper surface is greater than a centerline surface roughness (Ra) of the second upper surface, and
wherein a centerline surface roughness (Ra) of the boundary surface is greater than the centerline surface roughness (Ra) of the second upper surface.

8. The circuit board of claim 1, wherein the circuit pattern includes a trace portion disposed on the primer layer and connected to the pad portion, and
wherein the trace portion has a fourth thickness greater than the first thickness and penetrates the first portion of the protective layer along the vertical direction.

9. The circuit board of claim 8, wherein the circuit pattern includes an embedded pad portion and an embedded trace portion including at least a part embedded in the second portion of the protective layer, and
wherein a thickness of the second portion of the protective layer in a region overlapping the embedded pad portion along the vertical direction is greater than a thickness of the second portion in a region overlapping the embedded trace portion along the vertical direction.

10. The circuit board of claim 9, wherein a width of the embedded pad portion is greater than a width of the embedded trace portion,
   wherein the embedded pad portion includes a first embedded pad portion having a first width and a second embedded pad portion having a second width greater than the first width,
   wherein the second portion of the protective layer includes:
   a second-first portion overlapping the first embedded pad portion along the vertical direction, a second-second portion overlapping the second embedded pad portion along the vertical direction, and a second-third portion overlapping the embedded trace portion along the vertical direction,
   wherein a thickness of each of the second-first portion and the second-second portion is greater than a thickness of the second-third portion, and
   wherein the thickness of the second-first portion and the thickness of the second-second portion are different.

11. The circuit board of claim 10, wherein the thickness of the second-second portion is greater than the thickness of the second-first portion.

* * * * *